(12) United States Patent
Hebiguchi

(10) Patent No.: US 9,638,760 B2
(45) Date of Patent: May 2, 2017

(54) STORAGE DEVICE STATE DETECTION METHOD

(71) Applicant: ALPS ELECTRIC CO., LTD., Tokyo (JP)

(72) Inventor: Hiroyuki Hebiguchi, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 279 days.

(21) Appl. No.: 14/670,190

(22) Filed: Mar. 26, 2015

(65) Prior Publication Data

US 2015/0198675 A1   Jul. 16, 2015

Related U.S. Application Data

(63) Continuation of application No. PCT/JP2013/006562, filed on Nov. 7, 2013.

(30) Foreign Application Priority Data

Nov. 12, 2012 (JP) .................................. 2012-248512

(51) Int. Cl.
G01N 27/416 (2006.01)
G01R 31/36 (2006.01)
H01M 10/48 (2006.01)

(52) U.S. Cl.
CPC ..... *G01R 31/3675* (2013.01); *G01R 31/3606* (2013.01); *G01R 31/3662* (2013.01);
(Continued)

(58) Field of Classification Search
CPC .................................................. G01R 31/3675
(Continued)

(56) References Cited

U.S. PATENT DOCUMENTS 6,137,269 A * 10/2000 Champlin ................ G01K 7/42
320/134
7,443,139 B2 * 10/2008 Mitsui ................ G01R 31/3624
320/132

(Continued)

FOREIGN PATENT DOCUMENTS

JP          06-260215         9/1994
JP         2009-115738       5/2009

(Continued)

OTHER PUBLICATIONS

Search Report dated Jan. 28, 2014 from International Application No. PCT/JP2013/006562.

*Primary Examiner* — Richard V Muralidar
(74) *Attorney, Agent, or Firm* — Beyer Law Group LLP

(57) ABSTRACT

In a storage device state detection method in which the SOH or SOC of the storage device is inferred from the internal impedance of the storage device: the internal resistance of the storage device is measured by using a signal with a first frequency at which the internal impedance is reduced as a temperature is raised, and the initial SOH or initial SOC of the storage device is calculated from the measured value of the internal resistance; the internal impedance is measured by using a signal with a second frequency at which the internal impedance is increased as a temperature is raised, and the internal temperature of the storage device is calculated from the measured value of the internal impedance; and the SOH or SOC is inferred by using the calculated value of the internal temperature to correct the initial SOH or initial SOC.

18 Claims, 13 Drawing Sheets

(52) U.S. Cl.
CPC ........ *G01R 31/3679* (2013.01); *H01M 10/48* (2013.01); *H01M 10/486* (2013.01); *G01R 31/3624* (2013.01)

(58) Field of Classification Search
USPC .................................. 320/132; 324/430, 431
See application file for complete search history.

(56) References Cited

U.S. PATENT DOCUMENTS

| | | | |
|---|---|---|---|
| 8,684,596 B2* | 4/2014 | Nishi | G01K 7/42 374/141 |
| 9,229,061 B2* | 1/2016 | Hebiguchi | H01M 10/48 |
| 2012/0099618 A1 | 4/2012 | Nishi et al. | |
| 2015/0253204 A1* | 9/2015 | Hebiguchi | G01K 7/00 324/430 |
| 2016/0069963 A1* | 3/2016 | Hebiguchi | G01R 31/3662 324/430 |

FOREIGN PATENT DOCUMENTS

| | | |
|---|---|---|
| JP | 2010-067502 | 3/2010 |
| JP | 2011-18532 | 1/2011 |
| JP | 2012-220199 | 11/2012 |

\* cited by examiner

STORAGE DEVICE STATE DETECTION METHOD

CLAIM OF PRIORITY

This application is a Continuation of International Application No. PCT/JP2013/006562 filed on Nov. 7, 2013, which claims benefit of Japanese Patent Application No. 2012-248512 filed on Nov. 12, 2012. The entire contents of each application noted above are hereby incorporated by reference.

BACKGROUND OF THE INVENTION

1. Field of the Invention

The present invention relates to a method of detecting states of a storage device, and more particularly to a storage device state detection method of detecting the state of health and state of charge of a storage device.

2. Description of the Related Art

Storage devices such as lithium-ion secondary batteries and electric double-layer capacitors are used in various applications; for example, they are widely used in battery packs in mobile telephones, batteries in personal computers (PCs), and batteries in automobiles. In this case, it is very important to detect states of a storage device such as, for example, the state of health (SOH) and the state of charge (SOC). Particularly as for automobiles, detection of states of a storage device in an energy-saving automobile, which performs idle reduction, a hybrid automobile, an electric car is closely related to the running of the automobile, attracting attention as being very important.

A generally well-known method of detecting states of a storage device is to measure the voltage, current, and temperature of the storage device and calculate its SOH and SOC. Of these measurement parameters, the temperature of the storage device is very important because the temperature of the storage device largely affects storage device state detection.

As related art of a method of measuring the temperature of a storage device, a method of directly measuring the temperature with a temperature detecting element attached or connected to the storage device, as described in Japanese Unexamined Patent Application Publication No. 6-260215, is generally known. In Japanese Unexamined Patent Application Publication No. 6-260215, a zener diode is used as the temperature detecting element; the zener diode is connected to the positive terminal of a storage device so that a temperature transferred from the positive terminal of the storage device can be accurately measured. In Japanese Unexamined Patent Application Publication No. 6-260215 (first conventional example), however, there has been the problem that a large difference may occur between a temperature in the storage device and a temperature at a temperature detection point (in the first conventional example, the positive terminal of the storage device) of the temperature detecting element, in which case an accurate temperature of the storage device cannot be measured.

By contrast, in a device proposed in Japanese Unexamined Patent Application Publication No. 2010-67502, the temperature of a storage device is detected by using a temperature detecting element such as a thermocouple, the internal impedance of the storage device is obtained, and the SOH of the storage device is decided. In a device proposed in U.S. Pat. No. 6,137,269, the internal impedance of the storage device is obtained without using a temperature detecting element, and the internal temperature of the storage device is determined.

A storage device in Japanese Unexamined Patent Application Publication No. 2010-67502 (second conventional example) includes a temperature adjusting means for adjusting the temperature of the storage device, an impedance calculating means for calculating the internal impedance of the storage device, and a deterioration deciding means for deciding the SOH of the storage device according to the calculated internal impedance. The SOH can be decided with reference to an internal impedance map that has been preset in correspondence to the temperature of the storage device and its voltage according to the voltage of the storage device and its temperature and to an internal impedance value calculated in a state in which the storage device has been adjusted to a temperature within a prescribed range by the temperature adjusting means when the storage device is charged or discharged with an alternating current at a prescribed frequency (at least 10 Hz and at most 1 kHz).

The device, in U.S. Pat. No. 6,137,269 (third conventional example), that determine an internal temperature includes an electric excitation circuit that applies time-varying electric excitation to a storage device, a response detecting circuit that detects an electric response that varies with time as a result of the time-varying electric excitation, and a calculation circuit that determines an internal temperature by using a voltage and current signal derived from entered excitation and an entered response signal. Time-varying electric excitation is provided at different frequencies (in an embodiment, 5 Hz, 70 Hz, and 1 kHz), a measured impedance is assigned to an assumed equivalent circuit, and the internal temperature of the storage device is calculated from a particular element value of the equivalent circuit.

SUMMARY OF THE INVENTION

In the second conventional example, however, the internal impedance is measured at a low frequency (in the second conventional example, at least 10 Hz and at most 1 kHz), at which the internal impedance is affected by the behavior of ions in an electrolyte in the storage device. To measure the internal impedance accurately, therefore, a measurement is made in a state in which the storage device has been adjusted to a temperature within a prescribed range by the temperature adjusting means so that the internal impedance is not affected by a temperature. In this method, there is a time difference between a temperature around the storage device that has been adjusted by the temperature adjusting means and the true internal temperature of the storage device in temperature variations during charging and discharging. Therefore, an accurate internal temperature of the storage device could not be obtained at the time of state detection. Thus, there has been the problem that a correction for the effects by the internal temperature is not accurately made and error is thereby caused in an SOH decision.

In the third conventional example, it is preferable to use a frequency with few variations in the SOC in measurement. As in the second conventional example, however, the internal impedance is measured at a low frequency (in the third conventional example, 5 Hz, 70 Hz, and 1 kHz) at which the internal impedance is affected by the behavior of ions in an electrolyte in the storage device. Depending on the SOH and SOC of the storage device, therefore, the measured value of the internal impedance varies, so the accurate internal temperature of the storage device could not be obtained. Therefore, even if an internal temperature calculating method as in the third conventional example is used, there has been the problem that the SOH and SOC of the storage device cannot be accurately detected.

The present invention provides a storage device state detection method of accurately detecting the SOH and SOC of a storage device.

In a storage device state detection method in which the SOH of the storage device is inferred from the internal impedance of the storage device, the storage device state detection method of the present invention includes:

measuring the internal resistance of the storage device by using a signal with a first frequency at which the internal impedance of the storage device is reduced as a temperature is raised, and calculating the initial SOH of the storage device from the measured value of the internal resistance; measuring the internal impedance of the storage device by using a signal with a second frequency at which the internal impedance of the storage device is increased as a temperature is raised, and calculating the internal temperature of the storage device from the measured impedance value of the internal impedance; and inferring the SOH by using the calculated value of the internal temperature to correct the initial SOH.

Accordingly, in the storage device state detection method of the present invention, the initial SOH of the storage device is calculated from the measured value of the internal resistance of the storage device at a first frequency, the internal temperature is calculated from the measured impedance value of the internal impedance of the storage device, and the SOH is inferred by using the calculated value of the internal temperature to correct the initial SOH, so an accurate SOH can be obtained because the initial SOH can be corrected according to the calculated internal temperature. Particularly, since the internal impedance of the storage device is measured by using a signal with a second frequency at which the internal impedance of the storage device is increased as a temperature is raised, the resistance, depending only on the temperature, of the storage device in electronic conduction can be measured and the internal temperature of the storage device can thereby be more accurately measured. Therefore, the initial SOH can be corrected according to the accurate internal temperature. Thus, the SOH of the storage device can be accurately detected.

In a storage device state detection method in which the SOH of the storage device is inferred from the internal impedance of the storage device, the storage device state detection method of the present invention includes: measuring the internal resistance of the storage device by using a signal with a first frequency at which the capacitance component of the internal impedance of the storage device becomes more dominant than its inductance component, and calculating the initial SOH of the storage device from the measured value of the internal resistance; measuring the internal impedance of the storage device by using a signal with a second frequency at which the inductance component of the internal impedance of the storage device becomes more dominant than its capacitance component, and calculating the internal temperature of the storage device from the measured impedance value of the internal impedance; and inferring the SOH by using the calculated value of the internal temperature to correct the initial SOH.

Accordingly, the initial SOH of the storage device is calculated from the measured value of the internal resistance of the storage device at a first frequency, the internal temperature is calculated from the measured impedance value of the internal impedance of the storage device, and the SOH is inferred by using the calculated value of the internal temperature to correct the initial SOH, so an accurate SOH can be obtained because the initial SOH can be corrected according to the calculated internal temperature. Particularly, since the internal impedance of the storage device is measured by using a signal with a second frequency at which the inductance component of the internal impedance of the storage device becomes more dominant than its capacitance component, that is, its reactance component becomes inductive, the internal impedance can be measured in a state in which effects by the behavior of ions are adequately reduced and the internal temperature of the storage device can thereby be more accurately measured. Therefore, the initial SOH can be corrected according to the accurate internal temperature. Thus, the SOH of the storage device can be accurately detected.

In a storage device state detection method in which the SOH of the storage device is inferred from the internal impedance of the storage device, the storage device state detection method of the present invention includes: measuring the internal resistance of the storage device by using a signal with a first frequency that ions in the storage device can follow, and calculating the initial SOH of the storage device from the measured value of the internal resistance; measuring the internal impedance of the storage device by using a signal with a second frequency that is hard for the ions in the storage device to follow, and calculating the internal temperature of the storage device from the measured impedance value of the internal impedance; and inferring the SOH by using the calculated value of the internal temperature to correct the initial SOH.

Accordingly, the initial SOH of the storage device is calculated from the measured value of the internal resistance of the storage device at a first frequency, the internal temperature is calculated from the measured impedance value of the internal impedance of the storage device, and the SOH is inferred by using the calculated value of the internal temperature to correct the initial SOH, so an accurate SOH can be obtained because the initial SOH can be corrected according to the calculated internal temperature. Particularly, since the internal impedance of the storage device is measured by using a signal with a second frequency that is hard for ions in an electrolyte in the storage device to follow, the internal impedance can be measured in a state in which effects by the behavior of the ions are adequately reduced and the internal temperature of the storage device can thereby be more accurately measured. Therefore, the initial SOH can be corrected according to the accurate internal temperature. Thus, the SOH of the storage device can be accurately detected.

In a storage device state detection method in which the SOH of the storage device is inferred from the internal impedance of the storage device, the storage device state detection method of the present invention includes: measuring the internal resistance of the storage device by using a signal with a first frequency of 1 kHz or lower, and calculating the initial SOH of the storage device from the measured value of the internal resistance; measuring the internal impedance of the storage device by using a signal with a second frequency of 10 kHz or higher, and calculating the internal temperature of the storage device from the measured impedance value of the internal impedance; and inferring the SOH by using the calculated value of the internal temperature to correct the initial SOH.

Accordingly, the initial SOH of the storage device is calculated from the measured value of the internal resistance of the storage device at a first frequency, the internal temperature is calculated from the measured impedance value of the internal impedance of the storage device, and the SOH is inferred by using the calculated value of the internal temperature to correct the initial SOH, so an accurate SOH can be obtained because the initial SOH can be corrected according to the calculated internal temperature. Particularly, since the internal impedance of the storage device is measured by using a signal with a second frequency of 10 kHz or higher, ions in the electrolyte in the storage device do not follow the second frequency, the internal impedance can be measured in a state in which effects by the behavior of ions are adequately reduced. Therefore, the internal temperature of the storage device can be more accurately measured, and the initial SOH can thereby be corrected according to the accurate internal temperature. Thus, the SOH of the storage device can be accurately detected.

In the storage device state detection method of the present invention, the SOC may be substantially the same in each measurement of the internal resistance.

Accordingly, since the SOC is substantially the same in each measurement of the internal resistance, effects on the internal resistance by a difference in the SOC can be reduced. Therefore, a more accurate initial SOH can be calculated, and the SOH of the storage device can thereby be more accurately detected.

In the storage device state detection method of the present invention, the internal resistance may be measured within a prescribed time after the storage device has been fully charged.

Accordingly, since the internal resistance is measured within a prescribed time after the storage device has been fully charged, when the SOC is always placed under a constant condition, effects on the internal resistance by a difference in the SOC can be reliably reduced. Therefore, an even more accurate initial SOH can be calculated, and the SOH of the storage device can thereby be even more accurately detected.

In a storage device state detection method in which the SOC of the storage device is inferred from the internal impedance of the storage device, the storage device state detection method of the present invention includes: measuring the internal resistance of the storage device by using a signal with a first frequency at which the internal impedance of the storage device is reduced as a temperature is raised, and calculating the initial SOC of the storage device from the measured value of the internal resistance; measuring the internal impedance of the storage device by using a signal with a second frequency at which the internal impedance of the storage device is increased as a temperature is raised, and calculating the internal temperature of the storage device from the measured impedance value of the internal impedance; and inferring the SOC by using the calculated value of the internal temperature to correct the initial SOC.

Accordingly, the initial SOC of the storage device is calculated from the measured value of the internal resistance of the storage device at a first frequency, the internal temperature is calculated from the measured impedance value of the internal impedance of the storage device, and the SOC is inferred by using the calculated value of the internal temperature to correct the initial SOC, so an accurate SOC can be obtained because the initial SOC can be corrected according to the calculated internal temperature. Particularly, since the internal impedance of the storage device is measured by using a signal with a second frequency at which the internal impedance of the storage device is increased as a temperature is raised, the resistance, depending only on the temperature, of the storage device in electronic conduction can be measured and the internal temperature of the storage device can thereby be more accurately measured. Therefore, the initial SOC can be corrected according to the accurate internal temperature. Thus, the SOC of the storage device can be accurately detected.

In a storage device state detection method in which the SOC of the storage device is inferred from the internal impedance of the storage device, the storage device state detection method of the present invention includes: measuring the internal resistance of the storage device by using a signal with a first frequency at which the capacitance component of the internal impedance of the storage device becomes more dominant than its inductance component, and calculating the initial SOC of the storage device from the measured value of the internal resistance; measuring the internal impedance of the storage device by using a signal with a second frequency at which the inductance component of the internal impedance of the storage device becomes more dominant than its capacitance component, and calculating the internal temperature of the storage device from the measured impedance value of the internal impedance; and inferring the SOC by using the calculated value of the internal temperature to correct the initial SOC.

Accordingly, the initial SOC of the storage device is calculated from the measured value of the internal resistance of the storage device at a first frequency, the internal temperature is calculated from the measured impedance value of the internal impedance of the storage device, and the SOC is inferred by using the calculated value of the internal temperature to correct the initial SOC, so an accurate SOC can be obtained because the initial SOC can be corrected according to the calculated internal temperature. Particularly, since the internal impedance of the storage device is measured by using a signal with a second frequency at which the inductance component of the internal impedance of the storage device becomes more dominant than its capacitance component, that is, its reactance component becomes inductive, the internal impedance can be measured in a state in which effects by the behavior of ions are adequately reduced and the internal temperature of the storage device can thereby be more accurately measured. Therefore, the initial SOC can be corrected according to the accurate internal temperature. Thus, the SOC of the storage device can be accurately detected.

In a storage device state detection method in which the SOC of the storage device is inferred from the internal impedance of the storage device, the storage device state detection method of the present invention includes: measuring the internal resistance of the storage device by using a signal with a first frequency that ions in the storage device can follow, and calculating the initial SOC of the storage device from the measured value of the internal resistance; measuring the internal impedance of the storage device by using a signal with a second frequency that is hard for the ions in the storage device to follow, and calculating the internal temperature of the storage device from the measured impedance value of the internal impedance; and inferring the SOC by using the calculated value of the internal temperature to correct the initial SOC.

Accordingly, the initial SOC of the storage device is calculated from the measured value of the internal resistance of the storage device at a first frequency, the internal temperature is calculated from the measured impedance value of the internal impedance of the storage device, and the SOC is inferred by using the calculated value of the internal temperature to correct the initial SOC, so an accurate SOC can be obtained because the initial SOC can be corrected according to the calculated internal temperature. Particularly, since the internal impedance of the storage device is measured by using a signal with a second frequency that is hard for ions in an electrolyte in the storage device to follow, the internal impedance can be measured in a state in which effects by the behavior of the ions are adequately reduced and the internal temperature of the storage device can thereby be more accurately measured. Therefore, the initial SOC can be corrected according to the accurate internal temperature. Thus, the SOC of the storage device can be accurately detected.

In a storage device state detection method in which the SOC of the storage device is inferred from the internal impedance of the storage device, the storage device state detection method of the present invention includes: measuring the internal resistance of the storage device by using a signal with a first frequency of 1 kHz or lower, and calculating the initial SOC of the storage device from the measured value of the internal resistance; measuring the internal impedance of the storage device by using a signal with a second frequency of 10 kHz or higher, and calculating the internal temperature of the storage device from the measured impedance value of the internal impedance; and inferring the SOC by using the calculated value of the internal temperature to correct the initial SOC.

Accordingly, the initial SOC of the storage device is calculated from the measured value of the internal resistance of the storage device at a first frequency, the internal temperature is calculated from the measured impedance value of the internal impedance of the storage device, and the SOC is inferred by using the calculated value of the internal temperature to correct the initial SOC, so an accurate SOC can be obtained because the initial SOC can be corrected according to the calculated internal temperature. Particularly, since the internal impedance of the storage device is measured by using a signal with a second frequency of 10 kHz or higher, ions in the electrolyte in the storage device do not follow the second frequency, the internal impedance can be measured in a state in which effects by the behavior of ions are adequately reduced. Therefore, the internal temperature of the storage device can be more accurately measured, and the initial SOC can thereby be corrected according to the accurate internal temperature. Thus, the SOC of the storage device can be accurately detected.

In the storage device state detection method of the present invention, the internal resistance may be measured before and after a large change of a current, and the internal resistance may be obtained from measured values obtained before and after the large change.

Accordingly, since the internal resistance is obtained from measured values obtained before and after a large change of a current, when a measurement is made under a plurality of different conditions, the internal resistance can be more accurately calculated, and the initial SOH and initial SOC can thereby be more accurately calculated. Thus, the SOH and SOC of the storage device can be more accurately detected.

In the storage device state detection method of the present invention, the storage device may be mounted in an automobile and the automobile may be stopping during the measurement of the internal resistance.

Accordingly, since the internal resistance is measured while the automobile is stopping, it is possible to reduce effects by noise due to variations in a load to the storage device, noise from an inverter intended for motor control, and other noise generated while the automobile is running. Since the noise has a frequency close to the band of the second frequency, therefore, the measurement of the internal temperature of the storage device is not affected. Accordingly, the initial SOH and initial SOC can be corrected according to a more accurate internal temperature, and the SOH and SOC of the storage device can thereby be even more accurately detected.

In the storage device state detection method of the present invention, the storage device includes an anode collector, an electrolyte, a separator, and a cathode collector and the second frequency is a frequency at which the impedance of at least one of the anode collector, electrolyte, separator, and cathode collector is measured as a resistance in electronic conduction.

Accordingly, since the frequency of the signal is the second frequency at which the impedance of at least one of the anode collector, electrolyte, separator, and cathode collector is measured mainly as a resistance in electronic conduction rather than ion conduction, a difference in the behavior of ions due to a difference in the SOC or SOH of the storage device is not largely reflected in the measured value. Therefore, since a resistance in electron conduction, that is, a resistance (R, real part) in an impedance is measured, a change in the internal impedance, depending only on the temperature, of the storage device can be measured and the internal temperature of the storage device can thereby be more accurately measured. Thus, the initial SOH and initial SOC can be corrected according to the more accurate internal temperature, and the SOH or SOC of the storage device can thereby be even more accurately detected.

In the storage device state detection method of the present invention, a transient response signal induced by a pulse signal given to the storage may be converted to a frequency component by a Fourier transform, the internal impedance at the second frequency may be calculated, and the calculated value may be used as the measured impedance value.

Accordingly, since a transient response signal induced in the storage device by a pulse signal given to the storage device is subjected to a Fourier transform to take, as the measured value, the calculated value of an internal impedance at a second frequency that ions do not follow or that is 10 kHz or higher, there is no need to provide an alternating-current signal source used to supply a signal with a high frequency to the storage device and there is also no need to supply a signal with a high frequency to the storage device anew. Thus, an alternating-current signal source used for measurement does not need to be prepared, so it is possible to reduce a cost to manufacture the storage device that uses the storage device state detection method of the present invention.

In the storage device state detection method of the present invention, the storage device is a secondary battery.

Accordingly, since the storage device is a secondary storage device of the type in which charging and discharging are repeated, the SOH and SOC of the storage device vary at each time. In the storage device state detection method of the present invention, however, a difference in the behavior of ions due to a difference in the SOC or SOH of the storage device is not largely reflected in the measured value of the internal impedance, so even if the storage device of this type is used, the internal temperature of the storage device can be accurately measured. Furthermore, when a secondary battery is applied to a product with a large capacity, a large difference occurs between the internal temperature of the storage device and its surface temperature due to heat that is internally generated by the storage device during charging and discharging with a large current. Even in this case, the internal temperature of the storage device can be accurately measured. Thus, the initial SOH and initial SOC can be corrected according to the even more accurate internal temperature, and the SOH and SOC of the storage device can thereby be increasingly even more accurately detected.

In the storage device state detection method of the present invention, a low-pass filter is provided between the storage device and a charging circuit connected to the storage device to remove noise at the second frequency, the noise being included in a signal generated in the charging circuit.

Accordingly, since a low-pass filter is provided between the storage device and a charging circuit connected to the storage device, noise at the second frequency, the noise being included in an internal temperature measurement signal generated in the charging circuit, can be removed. Therefore, it is possible to prevent precision in internal temperature measurement from being lowered by noise from the charging circuit and to maintain high precision in temperature calculation. Accordingly, the initial SOH and initial SOC can be corrected according to the accurate internal temperature, and the SOH and SOC of the storage device can thereby be even more accurately detected.

In the storage device state detection method of the present invention, a low-pass filter provided between the storage device and a load connected to the storage device is used to remove noise at the second frequency, the noise being included in a signal generated in the load.

Accordingly, since a low-pass filter is provided between the storage device and a load connected to the storage device, noise at the second frequency, the noise being included in an internal temperature measurement signal generated in the load, can be removed. Therefore, it is possible to prevent precision in internal temperature measurement from being lowered by noise from the load and to maintain high precision in temperature calculation. Accordingly, the initial SOH and initial SOC can be corrected according to the more accurate internal temperature, and the SOH and SOC of the storage device can thereby be even more accurately detected.

In the storage device state detection method of the present invention, the internal impedance of the storage device is measured by using a signal with the second frequency, the signal being generated from a switch power supply for a power converter connected to the storage device.

Accordingly, since the internal impedance of the storage device is measured by using a signal generated from a power converter, there is no need to separately provide a signal source that generates an internal temperature measurement signal. Therefore, it is possible to maintain high precision in temperature measurement and to reduce a cost required for a measurement system used in the storage device state detection method of the present invention.

In the storage device state detection method of the present invention, the internal impedance of the storage device is measured by using a signal with the second frequency at which the impedance of the storage device is lower than the impedance, as viewed from the storage device, of a charging circuit connected to the storage device.

Accordingly, since the internal impedance of the storage device is measured by using a signal with the second frequency at which the impedance of the storage device is lower than the impedance of a charging circuit, effects by the charging circuit are reduced in internal impedance measurement. Therefore, it is possible to increase precision in internal impedance measurement and thereby to calculate a temperature highly preciously. Accordingly, the initial SOH and initial SOC can be corrected according to the more accurate internal temperature, and the SOH and SOC of the storage device can thereby be even more accurately detected.

In the storage device state detection method of the present invention, the internal impedance of the storage device is measured by using a signal with the second frequency at which the impedance of the storage device is lower than the impedance, as viewed from the storage device, of a load connected to the storage device.

Accordingly, since the internal impedance of the storage device is measured by using a signal with the second frequency at which the impedance of the storage device is lower than the impedance of a load, effects by the load are reduced in internal impedance measurement. Therefore, it is possible to increase precision in internal impedance measurement and thereby to calculate a temperature highly preciously. Accordingly, the initial SOH and initial SOC can be corrected according to the more accurate internal temperature, and the SOH and SOC of the storage device can thereby be even more accurately detected.

In the storage device state detection method of the present invention, the phase of a current and the phase of a voltage produced by a signal with the second frequency are matched by a phase compensating circuit connected to the storage device.

Accordingly, since the phase of a current and the phase of a voltage are matched by a phase compensating circuit connected to the storage device, even if the performance of a detecting apparatus is not high, the internal impedance of the storage device can be precisely measured. Therefore, it is possible to maintain high precision in temperature measurement and to reduce a cost required for a measurement system used in the storage device state detection method of the present invention.

In the storage device state detection method of the present invention, the storage device and phase compensating circuit form a resonant circuit that resonates with the second frequency.

Accordingly, since the storage device and phase compensating circuit form a resonant circuit that resonates with the second frequency, the imaginary part of the impedance can be made to be 0 at a resonance frequency. Therefore, only the resistive component of the internal impedance of the storage device can be detected. Accordingly, the initial SOH and initial SOC can be corrected according to a more accurate internal temperature, and the SOH and SOC of the storage device can thereby be even more accurately detected.

In the storage device state detection method of the present invention, the phase compensating circuit includes a capacitor.

Accordingly, since the phase compensating circuit is formed so as to include a capacitor, the phase compensating circuit can match the phase of a current and the phase of a voltage with a simple structure. Thus, it is possible to manufacture the phase compensating circuit at a low cost and thereby to reduce a cost required for a measurement system used in the storage device state detection method of the present invention.

DESCRIPTION OF THE PREFERRED EMBODIMENTS

Embodiments of the present invention will be described below in detail with reference to the attached drawings.

First Embodiment

Figure 1:
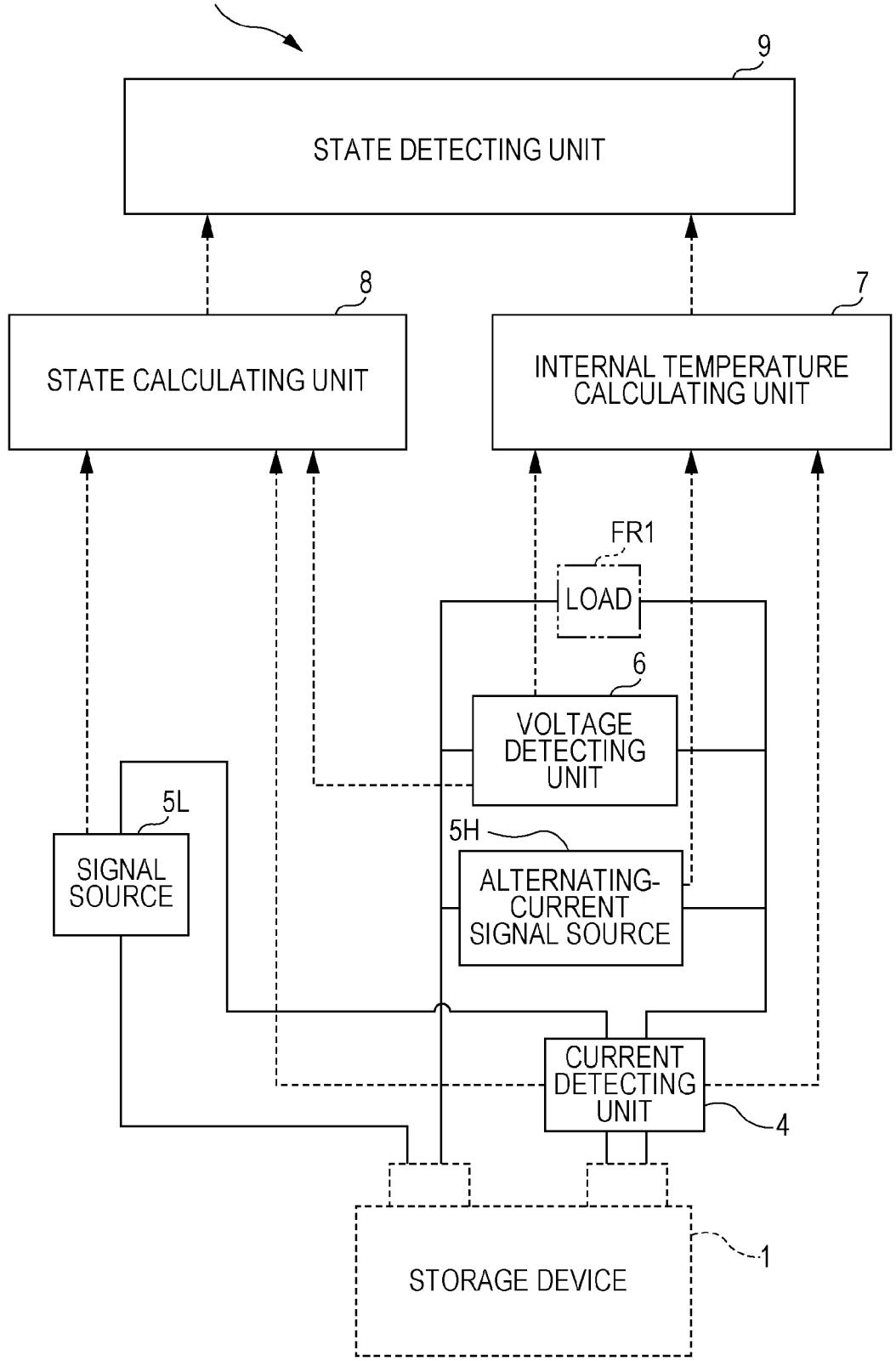
FIG. 1 illustrates a storage device state detection method in a first embodiment of the present invention, the drawing being a block diagram of a measurement system that measures the states (SOH and SOC) of the storage device.
Figure 2:
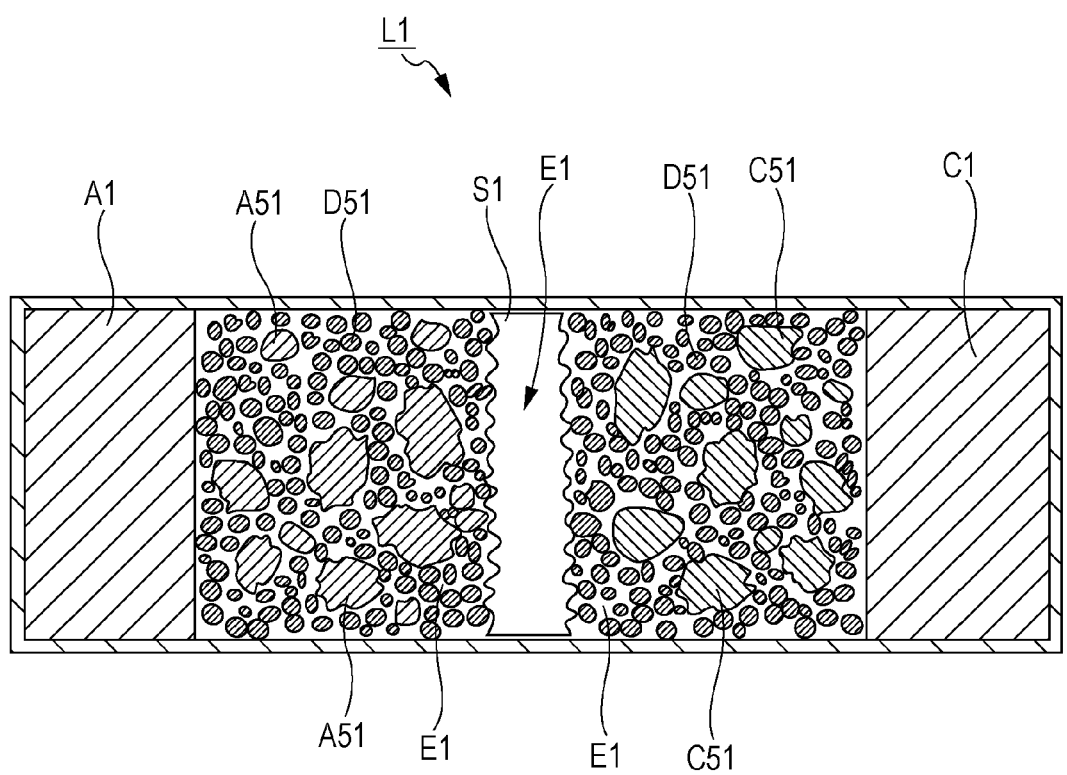
FIG. 2 illustrates the storage device state detection method in the first embodiment of the present invention, schematically illustrating the structure of a lithium-ion secondary battery.
Figure 3:
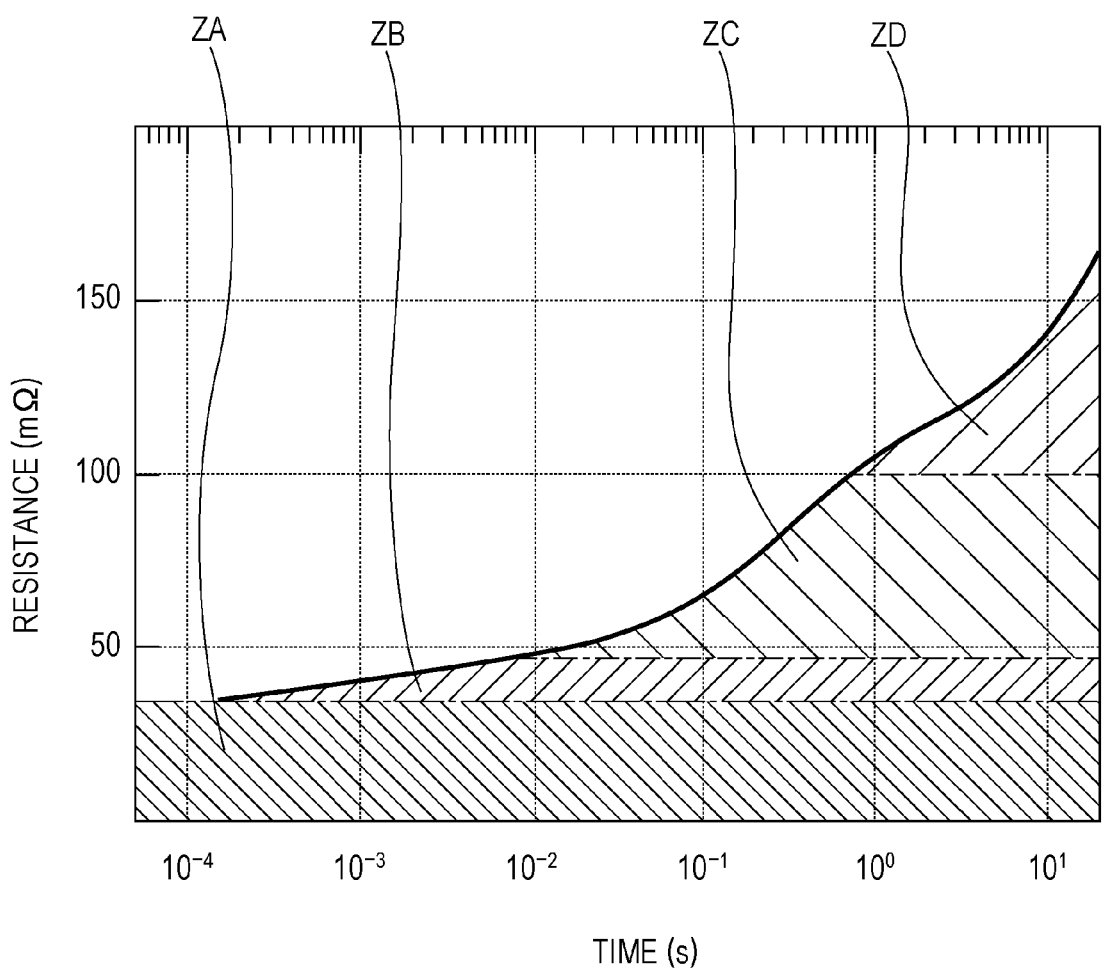
FIG. 3 illustrates the storage device state detection method in the first embodiment of the present invention, the drawing being an example of a graph representing the time dependence of the resistance of the storage device.

FIG. 1 illustrates a state detection method, in a first embodiment of the present invention, for a storage device 1; the drawing is a block diagram of a measurement system 101 that measures the states (SOH and SOC) of the storage device 1. FIG. 2 illustrates the state detection method, in the first embodiment of the present invention, for the storage device 1, schematically illustrating the structure of a lithium-ion secondary battery L1. FIG. 3 illustrates the state detection method, in the first embodiment of the present invention, for the storage device 1; the drawing is an example of a graph representing the time dependence of a resistance in the storage device 1.

In the state detection method, in the first embodiment of the present invention, for the storage device 1, the measurement system 101, illustrated in FIG. 1, that detects the states (SOH and SOC) of the storage device 1 is used. As illustrated in FIG. 1, the measurement system 101 includes an alternating-current signal source 5H used to supply a signal with a second frequency to the storage device 1, a signal source 5L used to supply an alternating-current signal with a first frequency or a direct-current signal to the storage device 1, a current detecting unit 4 and a voltage detecting unit 6 that respectively detect a current and a voltage observed by the storage device 1 when these signals are applied, an internal-temperature calculating unit 7 that calculates an internal temperature by using an entered signal with the second frequency and the detected current and voltage, a state calculating unit 8 that calculates the state of the storage device 1 by using an entered signal with the first frequency and the detected current and voltage, and a state detecting unit 9 that corrects the state calculated by the state calculating unit 8 by using the internal temperature calculated by the internal-temperature calculating unit 7 and then performs inference. The SOH referred to here indicates the deterioration state (degree of deterioration) of a storage device; it represents, as a percentage, the amount of full charge in a used storage device with respect to the amount of full charge in a non-used (new) storage device. The SOC indicates the charged state of the storage device; it represents a capacity remaining in the storage device as ampere-hours (Ah).

The storage device 1 is, for example, a chargeable chemical battery such a lithium secondary battery. However, a device, such as an electric double-layer capacitor, that can use ions to store electric energy is also included. Generally, the storage device 1 is structured mainly with an anode collector A1, a cathode collector C1, an electrolyte E1, and a separator S1. Besides the constituent elements described above, the lithium-ion secondary battery L1, for example, includes an anode active material A51, which is a material that stores electricity on the same side as the anode collector A1, a cathode active material C51, which is a material that stores electricity on the same side as the cathode collector C1, a conduction supporting agent D51, which is added so that electricity flows easily, a biding material, which is a binder, and the like, as illustrated in FIG. 2. As for the lithium-ion secondary battery L1, aluminum (Al) is most used as the anode collector A1, copper (Cu) is most used as the cathode collector C1, a solution of an organic solvent (such as $C_4H_6O_3$) and a solute of lithium salt (such as $LiPF_6$) is most used as the electrolyte E1, lithium cobaltate (such as $LiCoO_2$) is most used as the anode active material A51, and carbon (C) is most used as the cathode active material C51. Graphite crystals formed like a layer are used as carbon (C) in the cathode active material C51; a feature is that lithium is stored between layers in the state of ions.

The alternating-current signal source 5H is used to generate a signal with a high frequency of about 1 kHz or higher. The signal source 5L is used to generate a signal with a low frequency of about 1 kHz or lower. The signal source 5L can also generate a direct-current signal, in which the first frequency is zero.

The current detecting unit 4 is connected between the storage device 1 and a load FR1. The current detecting unit 4 is structured mainly with a current sensor used to detect a current and a control circuit for the current sensor; the current detecting unit 4 detects a current. As the current sensor, a compact current sensor that uses a magnetic resistive element, for example, can be used. The voltage detecting unit 6 detects the voltage of the storage device 1.

The internal-temperature calculating unit 7 measures the internal impedance of the storage device 1 by using the entered signal with the second frequency and the detected current and voltage at the second frequency, and calculates the internal temperature of the storage device 1 from the measured value of the internal impedance. The state calculating unit 8 measures the internal resistance of the storage device 1 by using the entered signal with the first frequency and the detected current and voltage at the first frequency, and calculates the initial SOH and initial SOC of the storage device 1 from the measured value of the internal resistance at the first frequency. The state detecting unit 9 corrects the states (initial SOH and initial SOC) calculated by the state calculating unit 8 by using the internal temperature calculated by the internal-temperature calculating unit 7 and infers the states (SOH and SOC) of the storage device 1.

It is well known that the measurement of the storage device 1 is largely affected by the behavior of ions in the storage device 1, as described above. FIG. 3 is a graph illustrating an example of a relationship between response times in the measurement of the resistance value of the storage device 1 and obtained resistance values. As illustrated in FIG. 3, when response time is about 0.2 ms or less, ion response does not follow, so the resistance value of the storage device 1 is obtained as the resistance value, in electronic conduction, of the constituent elements of the storage device 1 (see the area ZA in the drawing). When response time is increased to about 0.2 ms or more, reactive resistance against ions on the interface of the cathode collector C1 and the like are observed, so a resistance value due to the reaction is added, in addition to the above resistance value in electronic conduction (see the area ZB in the drawing). When response time is further increased to about 10 ms or higher, reactive resistance against ions on the interface of the anode collector A1 is observed, so a resistance value due to the reaction is further added, in addition to the above resistance value in electronic conduction (see the area ZC in the drawing). When reaction time is increased to about 1 second or more, ion diffusion occur, so a resistance value due to the diffusion is further added (see the area ZD in the drawing). As described above, the measurement of the resistance value of the storage device 1 is largely affected by the behavior of ions and is largely related to response time.

According to the technical concept described above, the state detection method, in the first embodiment of the present invention, for the storage device 1 is characterized in that a measurement was made in response time during which there is little or no effect by ions in the storage device 1. That is, the internal impedance of the storage device 1 is measured by using a signal with a second frequency that is hard for ions in the storage device 1 to follow, and the internal temperature of the storage device 1 is calculated from the measured value of the internal impedance. If a measurement is made by using a signal with a second frequency that is hard for ions in the storage device 1 to follow, specifically, a signal with a frequency of about 5 kHz (equivalent to about a response time of about 0.2 ms indicated in FIG. 3) or higher, response time can be shortened, so effects by the behavior of ions can be reduced and the true internal impedance of the constituent elements of the storage device 1 can be measured.

Since the internal impedance measured in this way depends only on the temperature, the internal temperature of the storage device 1 can be precisely calculated from the measured value of the internal impedance. That is, since a difference in the behavior of ions due to a difference in the SOC and SOH of the storage device 1 is not largely reflected in the measured value, the internal impedance of the storage device 1 that depends only on the temperature can be measured and the internal temperature of the storage device 1 can thereby be accurately measured. After the initial SOH or initial SOC of the storage device 1 is calculated from the measured value of the internal resistance of the storage device 1 at the first frequency, the SOH or SOC is inferred by using the above accurate internal temperature to correct the initial SOH or initial SOC. Thus, an accurate SOH or SOC can be obtained.

Since the storage device 1 measured in the state detection method, in the first embodiment of the present invention, for the storage device 1 is, for example, a secondary battery of the type in which charging and discharging are repeated, the SOH and SOC of the storage device 1 vary at each time. In the state detection method, in the first embodiment of the present invention, for the storage device 1, however, a difference in the behavior of ions due to a difference in the SOC and SOH of the storage device 1 is not largely reflected in the measured value, so even if the storage device 1 of this type is used, the internal temperature of the storage device 1 can be accurately measured. Furthermore, when the storage device 1 is applied to a product with a large capacity, a large difference occurs between the internal temperature of the storage device 1 and its surface temperature due to heat that is internally generated by the storage device 1 during charging and discharging with a large current. Even in this case, in the state detection method, in the first embodiment of the present invention, for the storage device 1, the internal temperature of the storage device 1 can be accurately measured.

Figure 4:
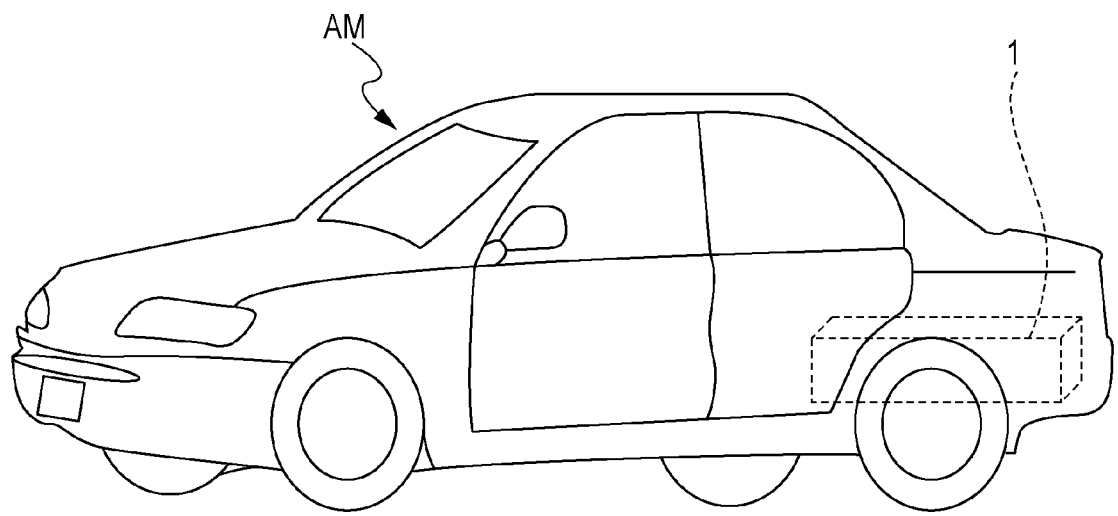
FIG. 4 illustrates the storage device state detection method in the first embodiment of the present invention, schematically illustrating a state in which the storage device is mounted in an automobile.

The above description has indicated that when the internal temperature of the storage device 1 is precisely measured, the SOH or SOC can be so accurately obtained. In addition, the SOH or SOC can be accurately obtained as described below. FIG. 4 illustrates the state detection method, in the first embodiment of the present invention, for the storage device 1, schematically illustrating a state in which the storage device 1 is mounted in an automobile AM.

In the state detection method, in the first embodiment of the present invention, for the storage device 1, it is preferable for the storage device 1 to be mounted in the automobile AM and for the automobile AM to be stopping during the measurement of the internal resistance. Thus, it is possible to reduce effects by noise due to variations in a load to the storage device 1, noise from an inverter intended for motor control, and other noise generated while the automobile AM is running. Since the noise has a frequency close to the band of the second frequency, therefore, the measurement of the internal temperature of the storage device 1 is not affected. Accordingly, the initial SOH or initial SOC can be corrected according to a more accurate internal temperature, and the SOH or SOC of the storage device 1 can thereby be even more accurately detected.

In the state detection method, in the first embodiment of the present invention, for the storage device 1, it is also preferable to measure the internal resistance before and after a large change of a current and to obtain the internal resistance from measured values before and after before and after the large change. An example of a time when a current largely changes is when an engine starts with the storage device 1 mounted in the automobile AM, as illustrated in, for example, FIG. 4. Since, in this case, a current and a voltage change before and after the engine starts, it is preferable to measure resistance values before and after the engine starts. Particularly, when the engine starts, a large current flows temporarily, so it is preferable to measure resistance values at points at which a difference in the current becomes the largest. Thus, when a measurement is made under a plurality of different conditions, the internal resistance can be more accurately calculated, and the initial SOH or initial SOC can thereby be more accurately calculated. Thus, the SOH or SOC of the storage device 1 can be more accurately detected.

In the state detection method, in the first embodiment of the present invention, for the storage device 1, it is also preferable for the SOC to be substantially the same in each measurement of the internal resistance. Particularly, as a specific example, it is preferable to measure the internal resistance within a prescribed time after the storage device 1 has been fully charged. Accordingly, since the SOC is reliably stable when the storage device 1 is fully charged, if the internal resistance is measured within the prescribed time, the SOC becomes further stable. This can reduce effects on the internal resistance by a difference in the SOC, and a more accurate initial SOH can thereby be calculated. Accordingly, the SOH of the storage device 1 can be more accurately detected.

So far, in the first embodiment, a method of detecting the SOH and SOC of the storage device 1 by using the measurement system 101 has been described. However, the method is not limited to the detection of the SOH and the SOC with the same apparatus; a method of detecting only the SOH or only the SOC is also included.

As described above, in the state detection method, in the first embodiment of the present invention, for the storage device 1, the initial SOH or initial SOC of the storage device 1 is calculated from the measured value of the internal resistance of the storage device 1 at a first frequency, the internal temperature is calculated from the measured impedance value of the internal impedance of the storage device 1, and the SOH or SOC is inferred by using the calculated value of the internal temperature to correct the initial SOH or initial SOC, so an accurate SOH or SOC can be obtained because the initial SOH or initial SOC can be corrected according to the calculated internal temperature. Particularly, since the internal impedance of the storage device 1 is measured by using a signal with a second frequency that is hard for ions in the electrolyte E1 in the storage device 1 to follow, the internal impedance can be measured in a state in which effects by the behavior of the ions are adequately reduced and the internal temperature of the storage device 1 can thereby be more accurately measured. Therefore, the initial SOH or initial SOC can be corrected according to the accurate internal temperature. Thus, the SOH or SOC of the storage device 1 can be accurately detected.

Since the SOC is substantially the same in each measurement of the internal resistance, effects on the internal resistance by a difference in the SOC can be reduced. Accordingly, a more accurate initial SOH can be calculated, and the SOH of the storage device 1 can be more accurately detected.

Since the internal resistance is measured within a prescribed time after the storage device 1 has been fully charged, when the SOC is always placed under a constant condition, effects on the internal resistance by a difference in the SOC can be reliably reduced. Therefore, an even more accurate initial SOH can be calculated, and the SOH of the storage device 1 can thereby be even more accurately detected.

Since the internal resistance is obtained from measured internal resistance values obtained before and after a large change of a current, when a measurement is made under a plurality of different conditions, the internal resistance can be accurately calculated, and the initial SOH or initial SOC can thereby be more accurately calculated. Thus, the SOH or SOC of the storage device 1 can be more accurately detected.

With the storage device 1 mounted in the automobile AM, the initial resistance is measured while the automobile AM is stopping, so it is possible to reduce effects by noise due to variations in a load to the storage device 1, noise from an inverter intended for motor control and other noise generated while the automobile AM is running. Since the noise has a frequency close to the band of the second frequency, therefore, the measurement of the internal temperature of the storage device 1 is not affected. Thus, the initial SOH or initial SOC can be corrected according to a more accurate internal temperature, and the SOH or SOC of the storage device 1 can thereby be even more accurately detected.

Since the frequency of a signal used to measure the storage device 1 is a second frequency at which the impedance of at least one of the anode collector A1, electrolyte E1, separator S1, and cathode collector C1 is measured mainly as a resistance in electronic conduction rather than ion conduction, a difference in the behavior of ions due to a difference in the SOC or SOH of the storage device 1 is not largely reflected in the measured value. Therefore, since a resistance in electron conduction, that is, a resistance (R, real part) in an impedance is measured, a change in the internal impedance, depending only on the temperature, of the storage device 1 can be measured and the internal temperature of the storage device 1 can thereby be more accurately measured. Thus, the initial SOH or initial SOC can be corrected according to a more accurate internal temperature, and the SOH or SOC of the storage device 1 can thereby be even more accurately detected.

Since the storage device 1 is a secondary storage device of the type in which charging and discharging are repeated, the SOH and SOC of the storage device 1 vary at each time. In the state detection method, in the first embodiment of the present invention, for the storage device 1, however, a difference in the behavior of ions due to a difference in the SOC and SOH of the storage device 1 is not largely reflected in the measured value, so even if the storage device 1 of this type is used, the internal temperature of the storage device 1 can be accurately measured. Furthermore, when a secondary battery is applied to a product with a large capacity, a large difference occurs between the internal temperature of the storage device 1 and its surface temperature due to heat that is internally generated by the storage device 1 during charging and discharging with a large current. Even in this case, the internal temperature of the storage device 1 can be accurately measured. Thus, the initial SOH or initial SOC can be corrected according to the even more accurate internal temperature, and the SOH or SOC of the storage device 1 can thereby be increasingly even more accurately detected.

Second Embodiment

Figure 5:
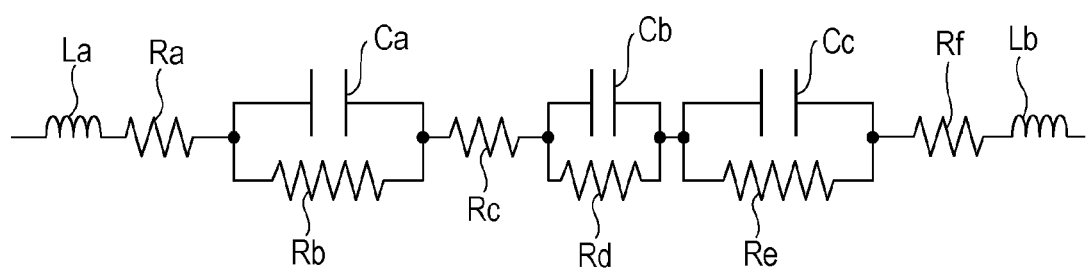
FIG. 5 illustrates a storage device state detection method in a second embodiment of the present invention, the drawing being an equivalent circuit diagram of a lithium secondary battery.

FIG. 5 illustrates a state detection method, in a second embodiment of the present invention, for the storage device 1; the drawing is an equivalent circuit diagram of the lithium secondary battery L1. In the state detection method, in the second embodiment of the present invention, for the storage device 1, a system similar to the measurement system 101, in FIG. 1, used in the first embodiment was used. As for the same structures as in the first embodiment, the same reference characters will be assigned and detailed descriptions will be omitted.

The system similar to the measurement system 101 includes, as in FIG. 1, the alternating-current signal source 5H used to supply a signal with a second frequency to the storage device 1, the signal source 5L used to supply an alternating-current signal with a first frequency or a direct-current signal to the storage device 1, the current detecting unit 4 and voltage detecting unit 6 that respectively detect a current and a voltage observed by the storage device 1 when these signals are applied, the internal-temperature calculating unit 7 that calculates an internal temperature by using an entered signal with the second frequency and the detected current and voltage, the state calculating unit 8 that calculates the state of the storage device 1 by using an entered signal with the first frequency and the detected current and voltage, and the state detecting unit 9 that corrects the state calculated by the state calculating unit 8 by using the internal temperature calculated by the internal-temperature calculating unit 7 and then performs inference.

Here, a case in which the lithium-ion secondary battery L1 (see FIG. 2) is used as the storage device 1 will be described in detail. The equivalent circuit in the lithium-ion secondary battery L1 illustrated in FIG. 2 includes inductors, electric resistors, and capacitors in the anode collector A1, electrolyte E1, separator S1, and cathode collector C1, as illustrated in FIG. 5.

In FIG. 5, La and Ra respectively indicate an inductor and an electric resistor in the anode collector A1, Ca and Rb respectively indicate a capacitor and an electric resistor that depend on a reaction at the positive-electrode part, Rc indicates an electric resistor attributable to the electrolyte E1, Cb and Rd respectively indicate a capacitor and an electric resistor attributable to ions that pass through the separator S1, Cc and Re respectively indicate a capacitor and an electric resistor attributable to a reaction at the negative-electrode part, and Lb and Rf respectively indicate an inductor and an electric resistor in the cathode collector C1.

In the internal impedance of the lithium-ion secondary battery L1, the behavior of ions largely affects the capacitor Ca and electric resistor Rb that depend on a reaction at the anode collector A1, the capacitor Cb and electric resistor Rd attributable to ions that pass through the separator S1, and the capacitor Cc and electric resistor Re attributable to a reaction at the negative-electrode part, as illustrated in FIG. 5. Noting this point, the inventor considered that if a condition can be implemented under which effects on the capacitor Ca and electric resistor Rb that depend on a reaction at the anode collector A1, the capacitor Cb and electric resistor Rd attributable to ions that pass through the separator S1, and the capacitor Cc and electric resistor Re attributable to the reaction at the negative-electrode part are adequately reduced, it would be possible to precisely measure the internal impedance.

That is, the main point of the present invention is to measure an internal impedance by using a signal with a second frequency at which the inductance component of the storage device 1 (for example, the lithium-ion secondary battery L1) becomes dominant, that is, its reactance component becomes inductive. At this high frequency, the capacitors Ca, Cb, and Cc are essentially short-circuited, so the internal impedance can be measured in a state in which effects by the behavior of ions are adequately reduced.

Since the second frequency of the signal used in the state detection method, in the second embodiment of the present invention, for the storage device 1 is high enough to make the inductance component dominant, that is, make the reactance component inductive and the impedance of at least one of the anode collector A1, electrolyte E1, separator S1, and cathode collector C1 is measured mainly as a resistance in electronic conduction rather than ion conduction, a difference in the behavior of ions due to a difference in the SOC or SOH of the storage device 1 is not largely reflected in the measured value. In addition, since a resistance in electron conduction, that is, a resistance (R, real part) in an impedance is measured, the resistance, depending only on the temperature, of the storage device 1 can be measured and the internal temperature of the storage device 1 can thereby be more accurately measured.

The internal resistance of the storage device 1 is measured by using a signal with a first frequency at which the capacitance component of the internal impedance of the storage device 1 becomes more dominant than its inductance component, that is, its reactance component becomes capacitive, and the initial SOH or initial SOC of the storage device 1 is calculated from the measured value of the internal resistance. Then, the initial SOH or initial SOC is corrected by using the accurate internal temperature described above, and the SOH or SOC is thereby be inferred. Thus, an accurate SOH or SOC can be obtained.

So far, in the second embodiment, a method of detecting the SOH and SOC of the storage device 1 by using a system similar to the measurement system 101 has been described. However, the method is not limited to the detection of the SOH and the SOC with the same apparatus; a method of detecting only the SOH or only the SOC is also included.

As described above, in the state detection method, in the second embodiment of the present invention, for the storage device 1, the initial SOH or initial SOC of the storage device 1 is calculated from the measured value of the internal resistance of the storage device 1 at a first frequency, the internal temperature is calculated from the measured impedance value of the internal impedance of the storage device 1, and the SOH or SOC is inferred by using the calculated value of the internal temperature to correct the initial SOH or initial SOC, so an accurate SOH or SOC can be obtained because the initial SOC or initial SOH can be corrected according to the calculated internal temperature. Particularly, since the internal impedance of the storage device 1 is measured by using a signal with a second frequency at which the inductance component of the internal impedance of the storage device 1 becomes more dominant than its capacitance component, that is, its reactance component becomes inductive, the internal impedance can be measured in a state in which effects by the behavior of ions are adequately reduced and the internal temperature of the storage device 1 can thereby be more accurately measured. Therefore, the initial SOH or initial SOC can be corrected according to the accurate internal temperature. Thus, the SOH or SOC of the storage device 1 can be accurately detected. The structure and method in the second embodiment of the present invention can be practiced by appropriately combining them with structures and methods in other embodiments.

Third Embodiment

Figure 6:
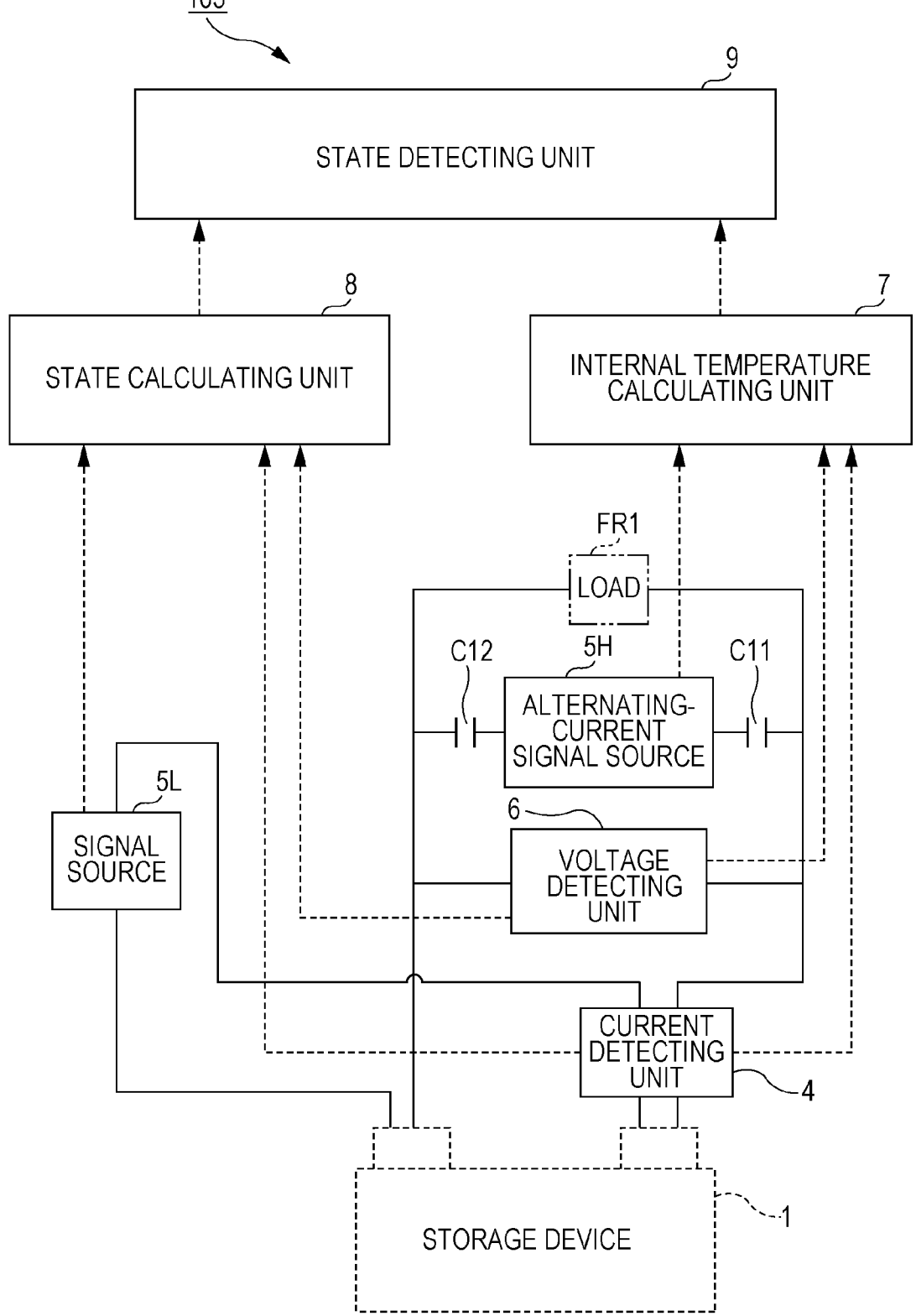
FIG. 6 illustrates a storage device state detection method in a third embodiment of the present invention, the drawing being a block diagram of a measurement system that measures the states (SOH and SOC) of the storage device.

FIG. 6 illustrates a state detection method, in a third embodiment of the present invention, for the storage device 1; the drawing is a block diagram of a measurement system 103 that measures the states (SOH and SOC) of the storage device 1. The state detection method, in the third embodiment, for the storage device 1 differs from the first embodiment in the structure of the alternating-current signal source 5H. As for the same structures as in the first embodiment, the same reference characters will be assigned and detailed descriptions will be omitted.

In the state detection method, in the third embodiment of the present invention, for the storage device 1, the measurement system 103, illustrated in FIG. 6, that measures the states (SOH and SOC) of the storage device 1 is used. As illustrated in FIG. 6, the measurement system 103 has a structure similar to the structure of the measurement system 101; the measurement system 103 includes the alternating-current signal source 5H used to supply a signal with a second frequency to the storage device 1, the signal source 5L used to supply an alternating-current signal with a first frequency or a direct-current signal to the storage device 1, the current detecting unit 4 and voltage detecting unit 6 that respectively detect a current and a voltage observed by the storage device 1 when these signals are applied, the internal-temperature calculating unit 7 that calculates an internal temperature by using an entered signal with the second frequency and the detected current and voltage, the state calculating unit 8 that calculates the state of the storage device 1 by using an entered signal with the first frequency and the detected current and voltage, and the state detecting unit 9 that corrects the state calculated by the state calculating unit 8 by using the internal temperature calculated by the internal-temperature calculating unit 7 and then performs inference.

In the measurement system 103, the alternating-current signal source 5H is connected in parallel to the load FR1 with capacitors (C11 and C12) intervening between them, and is not placed on the current path of the storage device 1. Thus, the alternating-current part is not included in the direct-current path, preventing direct-current power from being consumed in the alternating-current part. The measurement system 103 is used to measure the state of the storage device 1 with a second frequency at, for example, 100 kHz or higher.

The second frequency of the signal used in the state detection method, in the third embodiment of the present invention, for the storage device 1 is high enough to make the inductance component dominant, that is, make the reactance component inductive, as in the second embodiment. The impedance of at least one of the anode collector A1, electrolyte E1, separator S1, and cathode collector C1 is measured mainly as a resistance in electronic conduction rather than ion conduction. Therefore, a difference in the behavior of ions due to a difference in the SOC or SOH of the storage device 1 is not largely reflected in the measured value. In addition, since a resistance in electron conduction, that is, a resistance (R, real part) in an impedance is measured, the resistance, depending only on the temperature, of the storage device 1 can be measured and the internal temperature of the storage device 1 can thereby be more accurately measured.

A resistance in ion conduction and a resistance in electronic conduction can be distinguished from each other according to the temperature dependence of the impedance. In ion conduction, the higher temperature is, the larger the degree of ion movement is and the lower the impedance is (that is, the temperature dependence of the impedance is negative). In electronic conduction, particularly as for a metal, as a temperature is raised, electron movement is impeded by the vibration of atoms, so the impedance is increased (that is, the temperature dependence of the impedance is positive). Therefore, by using a second frequency (frequency at which the temperature dependence of the impedance becomes positive) at which the impedance is increased as a temperature is raised, the resistance, depending only on the temperature, of the storage device 1 in electronic conduction can be measured similarly and the internal temperature of the storage device 1 can thereby be more accurately measured.

The internal resistance of the storage device 1 is measured by using a signal with a first frequency at which the internal impedance of the storage device 1 is reduced as a temperature is raised, and the initial SOH or initial SOC of the storage device 1 is calculated from the measured value of the internal resistance. Then, it is also possible to infer the SOH or SOC by using the accurate internal temperature described above to correct the initial SOH or initial SOC. Therefore, an accurate SOH or SOC can be obtained.

So far, in the third embodiment, a method of detecting the SOH and SOC of the storage device 1 by using the measurement system 103 has been described. However, the method is not limited to the detection of the SOH and the SOC with the same apparatus; a method of detecting only the SOH or only the SOC is also included.

As described above, in the state detection method, in the third embodiment of the present invention, for the storage device 1, the initial SOH or initial SOC of the storage device 1 is calculated from the measured value of the internal resistance of the storage device 1 at a first frequency, the internal temperature is calculated from the measured impedance value of the internal impedance of the storage device 1, and the SOH or SOC is inferred by using the calculated value of the internal temperature to correct the initial SOH or initial SOC, so an accurate SOH or SOC can be obtained because the initial SOC or initial SOH can be corrected according to the calculated internal temperature. Particularly, since the internal impedance of the storage device 1 is measured by using a signal with a second frequency at which the internal impedance of the storage device 1 is increased as a temperature is raised, the resistance, depending only on the temperature, of the storage device 1 in electronic conduction can be measured and the internal temperature of the storage device 1 can thereby be more accurately measured. Therefore, the initial SOH or initial SOC can be corrected according to the accurate internal temperature. Thus, the SOH or SOC of the storage device 1 can be accurately detected. The structure and method in the third embodiment of the present invention can be practiced by appropriately combining them with structures and methods in other embodiments.

Fourth Embodiment

Figure 7:
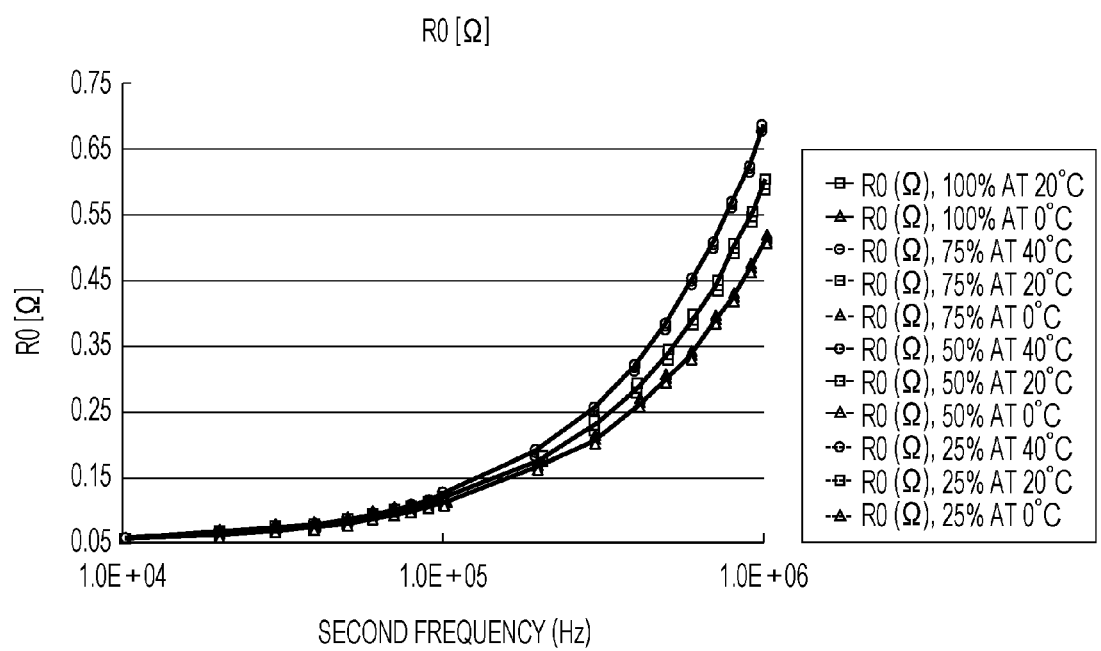
FIG. 7 illustrates a storage device state detection method in a fourth embodiment of the present invention, the drawing being an example of a graph representing a relationship between the frequency of a signal supplied to the storage device and the real part (resistance) of an internal impedance.

FIG. 7 illustrates a state detection method, in a fourth embodiment of the present invention, for the storage device 1; the drawing is an example of a graph representing a relationship between the frequency of a signal supplied to the storage device 1 and the real part (resistance) of an internal impedance. The state detection method, in the fourth embodiment, for the storage device 1 differs from the first embodiment in the specifications of the alternating-current signal source 5H in FIG. 1; a signal with a second frequency of 10 kHz or higher is generated. Since the second frequency at 10 kHz or higher is used in measurement, response time is reduced to 0.1 ms or small. Therefore, ions in the storage device 1 do not follow the second frequency as illustrated in FIG. 3, and a resistance value of the storage device 1 in electronic conduction is obtained. Thus, since the internal impedance of the storage device 1 is calculated at the second frequency at 10 kHz or higher and the calculated value is used as the measured value, temperature error due to a difference in the behavior of ions is not measured.

FIG. 7 indicates a relationship under the conditions that the charge ratio is 25%, 50%, 75%, and 100% and that temperature is 0° C., 20° C., and 40° C. From FIG. 7, it is confirmed that at the second frequency at which the inductance component is dominant, that is, the reactance component is inductive, the internal impedance depends mainly on the temperature and does not depend on the charge ratio. To increase impedance measurement precision, the second frequency used in measurement is preferably 10 kHz or higher and is more preferably 100 kHz or higher at which the impedance change with temperature is large. In view of ease of impedance measurement, it is preferable to suppress the first frequency of the signal to 1 MHz or lower. That is, it is preferable to measure the internal resistance of the storage device 1 with a signal with a first frequency of 1 kHz or lower, calculate the initial SOH or initial SOC of the storage device 1 from the measured value of the internal resistance at the first frequency, measure the internal impedance of the storage device 1 with a signal with a second frequency of 10 kHz, preferably 100 kHz or higher, calculate the internal temperature of the storage device 1 from the measured impedance value of the internal impedance, correct the initial SOH or initial SOC by using the measured value of the internal temperature, and infer the SOH or SOC. Thus, an accurate SOH or SOC can be obtained because the initial SOC or initial SOH can be corrected according to the calculated accurate internal temperature. When the state of the storage device 1 is measured by using a second frequency of 100 kHz or higher, it is preferable to use the measurement system 103 illustrated in FIG. 6.

Figure 14:
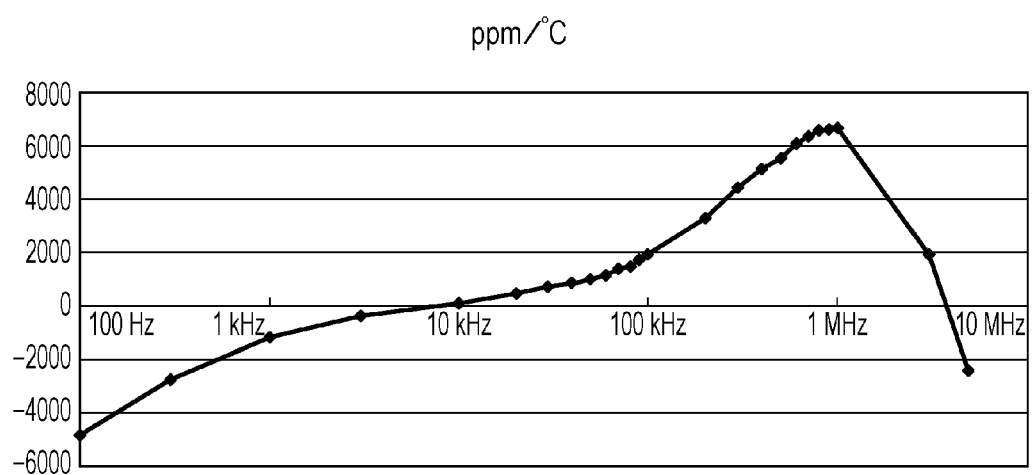
FIG. 14 is a graph representing a relationship between the frequency of a signal used in a measurement in the present invention and impedance variations with temperature.

FIG. 14 represents a relationship between the frequency of a signal used in measurement and impedance variations with temperature. In the example in FIG. 14, it is found that frequencies at which the impedance is reduced as a temperature is raised are lower than 10 kHz, and frequencies at which the impedance is increased as a temperature is raised are 10 kHz and higher. When the impedance is measured at a frequency at which the impedance is changed by a fixed value or more due to the temperature, the SOH and internal temperature can be more precisely measured. Therefore, the first frequency is preferably 1 kHz or lower and the second frequency is preferably at least 100 kHz and at most 1 MHz.

As described above, in the state detection method, in the fourth embodiment of the present invention, for the storage device 1, the initial SOH or initial SOC of the storage device 1 is calculated from the measured value of the internal resistance of the storage device 1 at a first frequency, the internal temperature is calculated from the measured impedance value of the internal impedance of the storage device 1, and the SOH or SOC is inferred by using the calculated value of the internal temperature to correct the initial SOH or initial SOC, so an accurate SOH or SOC can be obtained because the initial SOC or initial SOH can be corrected according to the calculated internal temperature. Particularly, since the internal impedance of the storage device 1 is measured by using a signal with a second frequency of 10 kHz or higher and the internal temperature of the storage device 1 is calculated from the measured value, ions in the electrolyte E1 in the storage device 1 do not follow the second frequency, so temperature error due to a difference in the behavior of ions is not measured. Therefore, a difference in the behavior of ions due to a difference in the SOC or SOH of the storage device 1 is not reflected in the measured value. Therefore, the internal impedance, depending only on the temperature, of the storage device 1 can be measured and the internal temperature of the storage device 1 can thereby be accurately measured. Thus, the initial SOH or initial SOC can be corrected by using this accurate internal temperature, and the SOH or SOC can be inferred, so the SOC or SOH of the storage device 1 can be accurately detected.

The structure and method in the fourth embodiment of the present invention can be practiced by appropriately combining them with structures and methods in other embodiments. So far, in the fourth embodiment, a method of detecting the SOH and SOC of the storage device 1 by using a measurement system has been described. However, the method is not limited to the detection of the SOH and the SOC with the same apparatus; a method of detecting only the SOH or only the SOC is also included.

Fifth Embodiment

Figure 8:
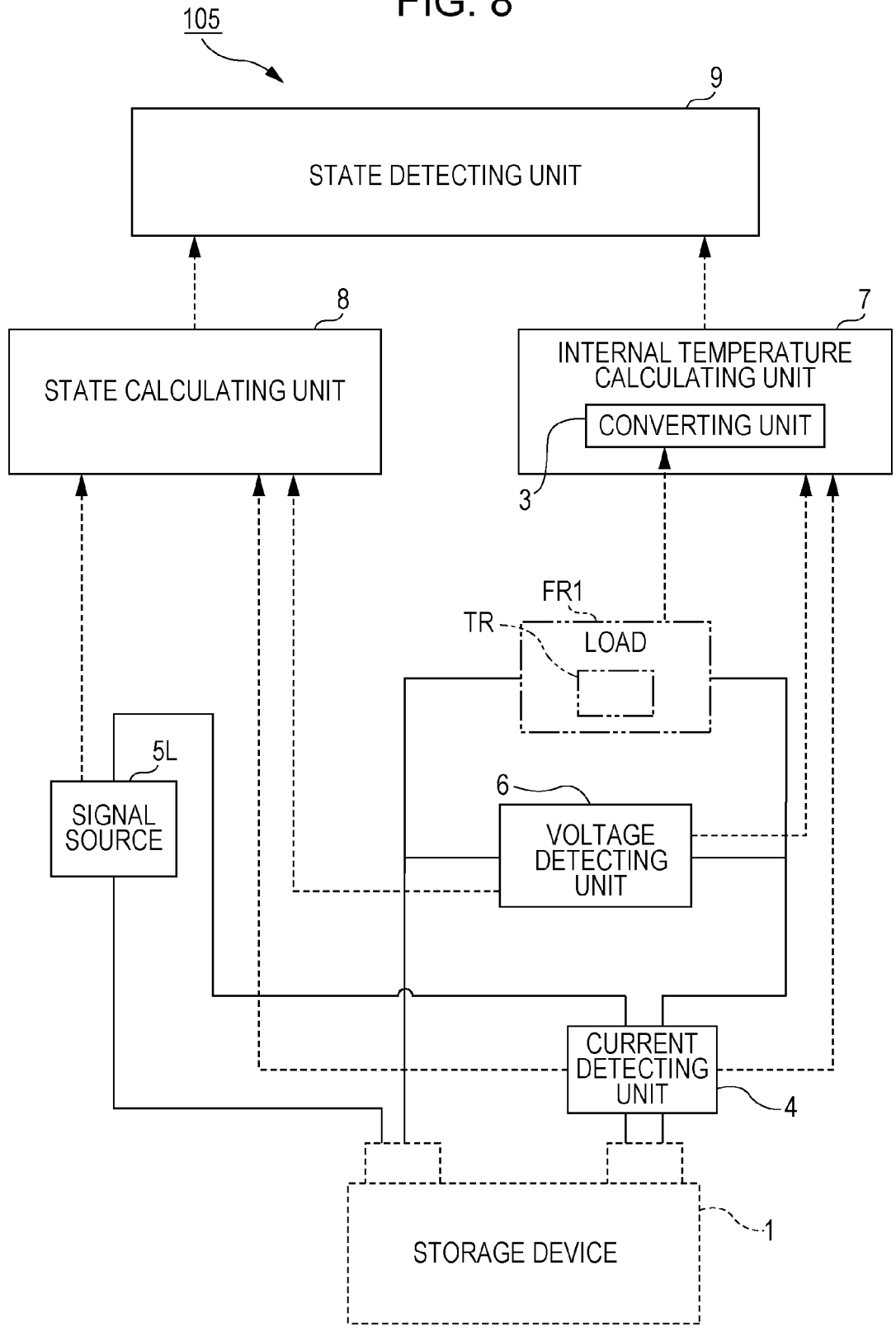
FIG. 8 illustrates a storage device state detection method in a fifth embodiment of the present invention, the drawing being a block diagram of another measurement system that measures the states (SOH and SOC) of the storage device.

FIG. 8 illustrates a state detection method in a fifth embodiment of the present invention, for the storage device 1; the drawing is a block diagram of a measurement system 105 that measures the states (SOH and SOC) of the storage device 1. The state detection method, in the fifth embodiment, for the storage device 1 differs from the first embodiment in that a converting unit 3 is provided that converts a pulse given to the storage device 1 to a frequency component. As for the same structures as in the first embodiment, the same reference characters will be assigned and detailed descriptions will be omitted.

In the state detection method, in the fifth embodiment of the present invention, for the storage device 1, the measurement system 105, illustrated in FIG. 8, that measures the states (SOH and SOC) of the storage device 1 is used. As illustrated in FIG. 8, the measurement system 105 includes the signal source 5L used to supply an alternating-current signal with a first frequency or a direct-current signal to the storage device 1, the converting unit 3 that converts the waveforms of the voltage and current of the storage device 1 to frequency components when a pulse signal is given to the storage device 1 in response to a trigger TR such as a switch-on event, the current detecting unit 4 and voltage detecting unit 6 that respectively detect a current and a voltage observed by the storage device 1 when the pulse is applied, the internal-temperature calculating unit 7 that calculates an internal temperature by using an entered signal with a second frequency and the detected current and voltage, the state calculating unit 8 that calculates the state of the storage device 1 by using an entered signal with the first frequency and the detected current and voltage, and the state detecting unit 9 that corrects the state calculated by the state calculating unit 8 by using the internal temperature calculated by the internal-temperature calculating unit 7 and then performs inference.

In the case of, for example, an automobile, the above trigger TR may be a switch-on event at the start of the engine, a time at which charging is performed when a regenerative brake is applied, a time at which the storage device 1 is rapidly charged, or the like. A pulse signal generated at this time is given to the storage device 1. A transient response signal induced in the storage device 1 by this pulse signal may be converted to a frequency component by using a Fourier transform. When the second frequency that is hard for ions in the storage device 1 to follow is selected from frequency components included in the pulse signal, the internal impedance of the storage device 1 at this second frequency is calculated, and the calculated value is used as the measured value, temperature error due to a difference in the behavior of the ions is not measured. Therefore, since a difference in the behavior of ions due to a difference in the SOC or SOH of the storage device 1 is not largely reflected in the measured value, the internal temperature of the storage device 1 can be accurately measured. In the state detection method, in the fifth embodiment of the present invention, for the storage device 1, the initial SOH or initial SOC of the storage device 1 is calculated from the internal resistance of the storage device 1 at the first frequency, after which the SOH or SOC is inferred by the accurate internal temperature described above to correct the initial SOH or initial SOC. Therefore, an accurate SOH or SOC can be obtained.

As described above, in the state detection method, in the fifth embodiment of the present invention, for the storage device 1, the initial SOH or initial SOC of the storage device 1 is calculated from the measured value of the internal resistance of the storage device 1 at a first frequency, the internal temperature is calculated from the measured impedance value of the internal impedance of the storage device 1, and the SOH or SOC is inferred by using the calculated value of the internal temperature to correct the initial SOH or initial SOC, so an accurate SOH or SOC can be obtained because the initial SOC or initial SOH can be corrected according to the calculated internal temperature. Particularly, since the internal impedance of the storage device 1 is measured by using a signal with a second frequency that is hard for ions in the electrolyte E1 in the storage device 1 to follow, the internal impedance can be measured in a state in which effects by the behavior of the ions are adequately reduced and the internal temperature of the storage device 1 can thereby be more accurately measured. Therefore, the initial SOH or initial SOC can be corrected according to the accurate internal temperature. Thus, the SOH or SOC of the storage device 1 can be accurately detected.

Since a transient response signal induced in the storage device 1 by a pulse signal given to the storage device 1 is subjected to a Fourier transform and the calculated value of an internal impedance at a second frequency that is hard for ions to follow is used as the measured value, there is no need to provide an alternating-current signal source used to supply a signal with a high frequency to the storage device 1 and there is also no need to supply a signal with a high frequency to the storage device 1 anew. Thus, an alternating-current signal source used for measurement does not need to be prepared, so it is possible to reduce a cost to manufacture the storage device 1 that uses the state detection method, in the fifth embodiment of the present invention, for the storage device 1.

The structure and method in the fifth embodiment of the present invention can be practiced by appropriately combining them with structures and methods in other embodiments. So far, in the fifth embodiment, a method of detecting the SOH and SOC of the storage device 1 by using the measurement system 105 has been described. However, the method is not limited to the detection of the SOH and the SOC with the same apparatus; a method of detecting only the SOH or only the SOC is also included.

Sixth Embodiment

Figure 9:
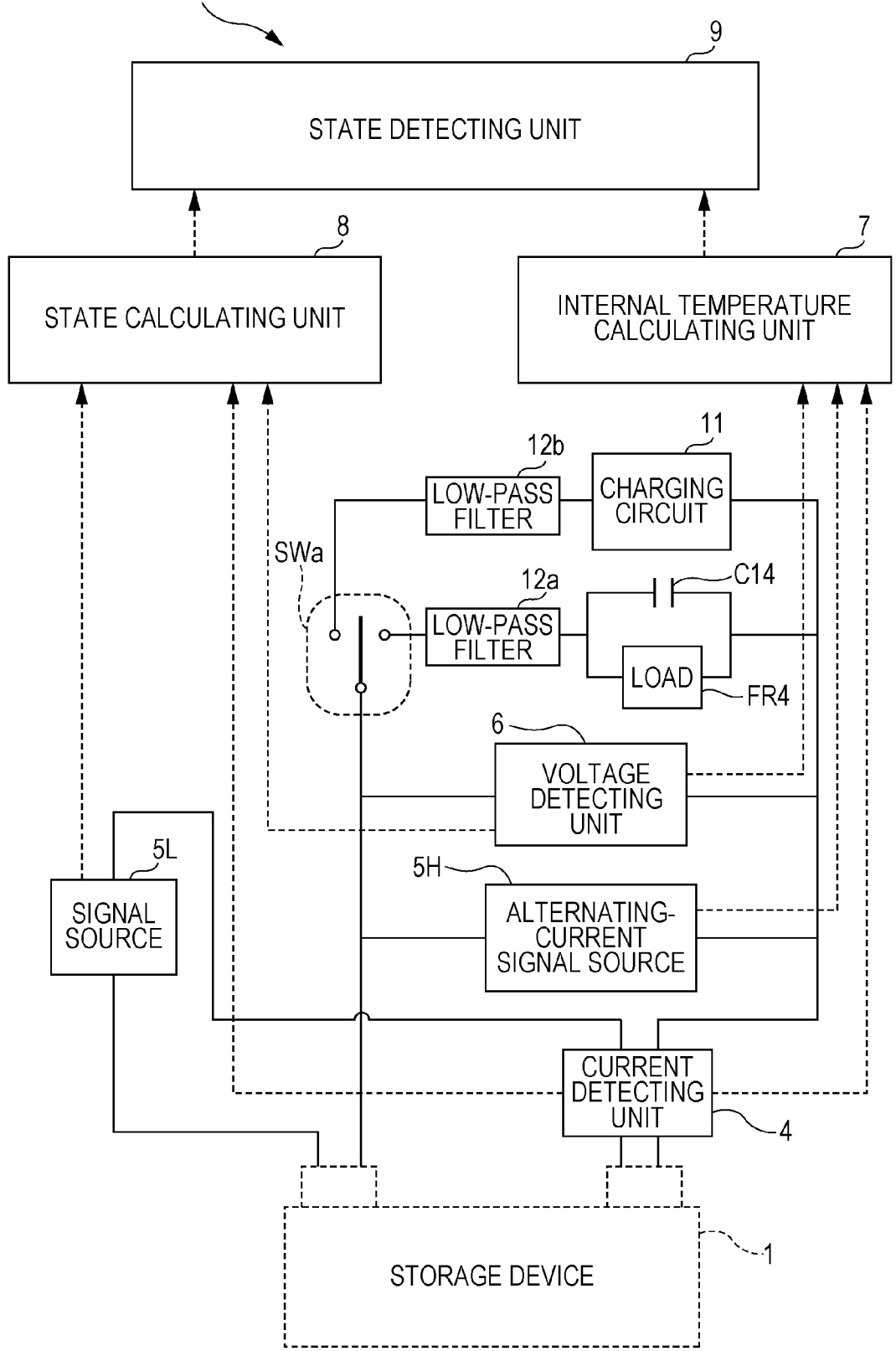
FIG. 9 illustrates a storage device state detection method in a sixth embodiment of the present invention; the drawing being a block diagram of a measurement system that measures the states (SOH and SOC) of the storage device.

FIG. 9 illustrates a state detection method, in a sixth embodiment of the present invention, for the storage device 1; the drawing is a block diagram of a measurement system 106 that measures the states (SOH and SOC) of the storage device 1. The state detection method, in the sixth embodiment, for the storage device 1 differs from the first embodiment in that low-pass filters 12a and 12b are used to remove high-frequency noise generated in a load FR4 and a charging circuit 11. As for the same structures as in the first embodiment, the same reference characters will be assigned and detailed descriptions will be omitted.

In the state detection method, in the sixth embodiment of the present invention, for the storage device 1, the measurement system 106, illustrated in FIG. 9, that measures the states (SOH and SOC) of the storage device 1 is used. As illustrated in FIG. 9, the measurement system 106 includes the signal source 5L used to supply an alternating-current signal with a first frequency or a direct-current signal to the storage device 1, the alternating-current signal source 5H used to supply a signal with a second frequency to the storage device 1, the current detecting unit 4 and voltage detecting unit 6 that respectively detect a current and a voltage observed by the storage device 1 when these signals are applied, the internal-temperature calculating unit 7 that calculates the internal temperature of the storage device 1 by using a signal with the second frequency, the signal being entered from the alternating-current signal source 5H, and the current and voltage that are respectively detected by the current detecting unit 4 and voltage detecting unit 6, the state calculating unit 8 that calculates the state of the storage device 1 by using an entered signal with the first frequency and the detected current and voltage, and the state detecting unit 9 that corrects the state calculated by the state calculating unit 8 by using the internal temperature calculated by the internal-temperature calculating unit 7 and then performs inference.

In the storage device 1, the load FR4, to which to supply electric power, and the charging circuit 11, which charges the storage device 1, are mutually connected with a switch SWa intervening between them. By the switch SWa, the storage device 1 and load FR4 are mutually connected when the storage device 1 is discharged and the storage device 1 and charging circuit 11 are mutually connected when the storage device 1 is charged. Typically, the load FR4 is a power converting apparatus such as an inverter that converts direct-current power of the storage device 1 to alternating-current power. A capacitor C14 used to suppress a ripple current is connected in parallel to the load FR4.

The low-pass filter 12a is connected in series with the load FR4. The low-pass filter 12a, which is disposed between the load FR4 and the storage device 1, removes high-frequency components (noise) in a signal generated in the load FR4. The low-pass filter 12a is disposed closer to the storage device 1 than the capacitor C14, which suppresses a ripple current. Similarly, the low-pass filter 12b is connected in series with the charging circuit 11. The low-pass filter 12b, which is disposed between the charging circuit 11 and the storage device 1, removes high-frequency components (noise) in a signal generated in the charging circuit 11.

In the measurement system 106, the second frequency of a signal used to measure an internal temperature is higher than the pass bands of the low-pass filters 12a and 12b. That is, the high-frequency components (noise) in signals generated in the load FR4 and charging circuit 11 are removed by the low-pass filters 12a and 12b, so these high-frequency components do not affect detection precision of the current detecting unit 4 and voltage detecting unit 6. Therefore, it is possible to prevent precision in internal temperature measurement from being lowered by the signals from the load FR4 and charging circuit 11. In the state detection method, in the sixth embodiment of the present invention, for the storage device 1, the initial SOH or initial SOC of the storage device 1 is calculated from the internal resistance of the storage device 1 at the first frequency, after which the SOH or SOC is inferred by using the accurate internal temperature described above to correct the initial SOH or initial SOC. Therefore, an accurate SOH or SOC can be obtained.

As described above, in the state detection method, in the sixth embodiment of the present invention, for the storage device 1, the initial SOH or initial SOC of the storage device 1 is calculated from the measured value of the internal resistance of the storage device 1 at a first frequency, the internal temperature is calculated from the measured impedance value of the internal impedance of the storage device 1, and the SOH or SOC is inferred by using the calculated value of the internal temperature to correct the initial SOH or initial SOC, so an accurate SOH or SOC can be obtained because the initial SOC or initial SOH can be corrected according to the calculated internal temperature. Particularly, since the internal impedance of the storage device 1 is measured by using a signal with a second frequency at which the internal impedance of the storage device 1 is increased as a temperature is raised, the resistance, depending only on the temperature, of the storage device 1 in electronic conduction can be measured and the internal temperature of the storage device 1 can thereby be more accurately measured. Therefore, the initial SOH or initial SOC can be corrected according to the accurate internal temperature. Thus, the SOH or SOC of the storage device 1 can be accurately detected.

Since the low-pass filter 12b is provided between the storage device 1 and the charging circuit 11 connected to the storage device 1, noise at the second frequency, the noise being included in an internal temperature measurement signal generated in the charging circuit 11, can be removed. Therefore, it is possible to prevent precision in internal temperature measurement from being lowered by a signal from the charging circuit 11 and to maintain high precision in temperature calculation. Accordingly, the initial SOH or initial SOC can be corrected according to the more accurate internal temperature, and the SOH or SOC of the storage device 1 can thereby be even more accurately detected.

Since the low-pass filter 12a is provided between the storage device 1 and the load FR4 connected to the storage device 1, noise at the second frequency, the noise being included in an internal temperature measurement signal generated in the load FR4, can be removed. Therefore, it is possible to prevent precision in internal temperature measurement from being lowered by a signal from the load FR4 and to maintain high precision in temperature calculation. Accordingly, the initial SOH or initial SOC can be corrected according to the more accurate internal temperature, and the SOH or SOC of the storage device 1 can thereby be even more accurately detected.

The structure and method in the sixth embodiment of the present invention can be practiced by appropriately combining them with structures and methods in other embodiments. So far, in the sixth embodiment, a method of detecting the SOH and SOC of the storage device 1 by using the measurement system 106 has been described. However, the method is not limited to the detection of the SOH and the SOC with the same apparatus; a method of detecting only the SOH or only the SOC is also included.

Seventh Embodiment

Figure 10:
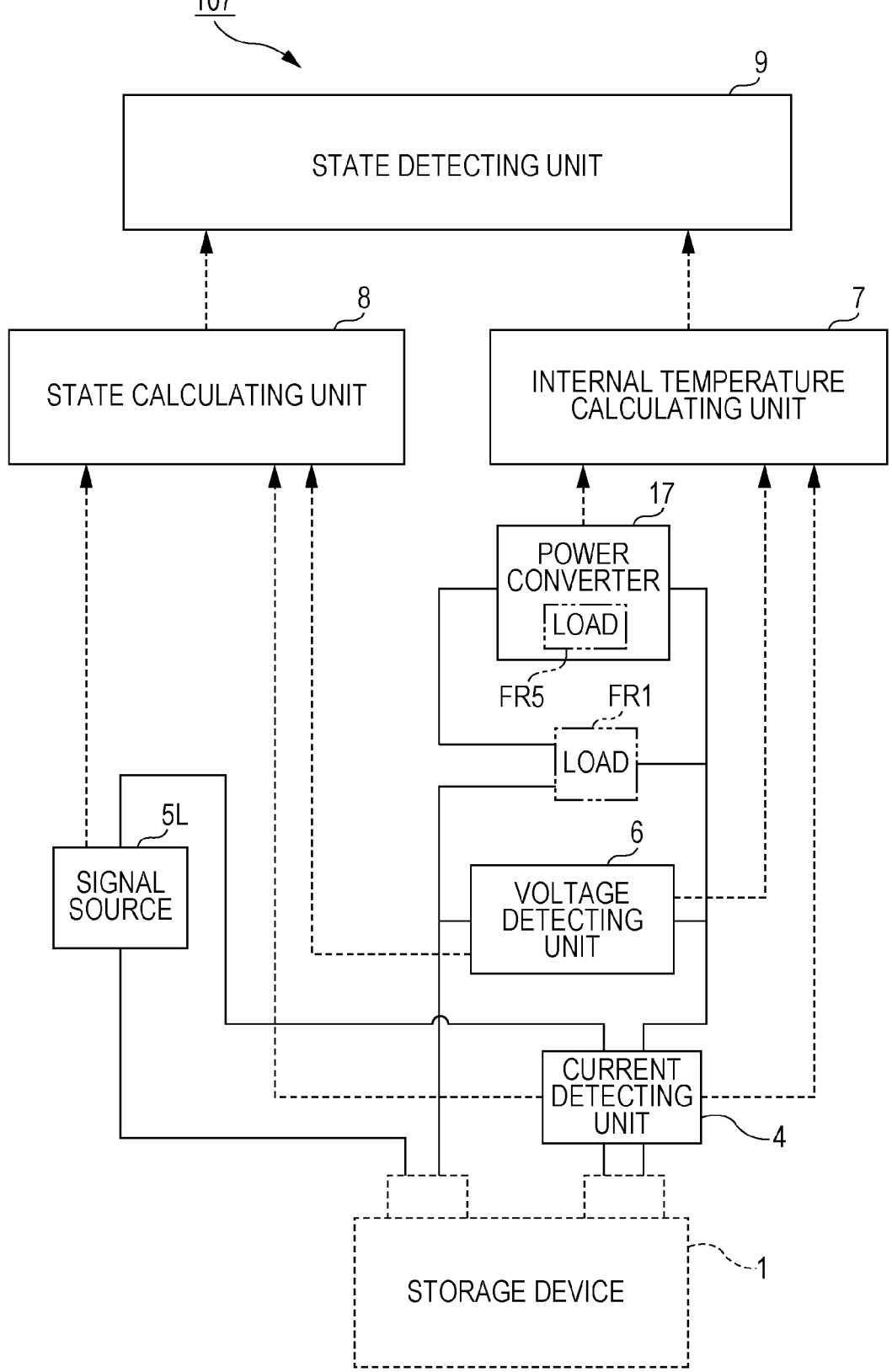
FIG. 10 illustrates a storage device state detection method in a seventh embodiment of the present invention; the drawing being a block diagram of a measurement system that measures the states (SOH and SOC) of the storage device.

FIG. 10 illustrates a state detection method, in a seventh embodiment of the present invention, for the storage device 1; the drawing is a block diagram of a measurement system 107 that measures the states (SOH and SOC) of the storage device 1. The state detection method, in the seventh embodiment, for the storage device 1 differs from the first embodiment in that the internal impedance of the storage device 1 is measured by using a high-frequency signal generated in a load FR5. As for the same structures as in the first embodiment, the same reference characters will be assigned and detailed descriptions will be omitted.

In the state detection method, in the seventh embodiment of the present invention, for the storage device 1, the measurement system 107, illustrated in FIG. 10, that measures the states (SOH and SOC) of the storage device 1 is used. In the measurement system 107, the load FR5, to which electric power is supplied from the storage device 1, is connected, as illustrated in FIG. 10. The load FR5, which is typically a power converter 17 such as an inverter that converts direct-current power in the storage device 1 to alternating-current power or a DC-DC converter, has a switch power supply (not illustrated) in which a switch frequency is fixed. The power converter 17 (load FR5) performs a switching operation by using a signal with a high frequency (second frequency) suitable for the measurement of the internal temperature of the storage device 1; the power converter 17 (load FR5) is structured so that the signal with the second frequency, the signal being involved in the switching operation, is used in the measurement.

The measurement system 107 also includes the signal source 5L used to supply an alternating-current signal with a first frequency or a direct-current signal to the storage device 1, the current detecting unit 4 and voltage detecting unit 6 that respectively detect a current and a voltage observed by the storage device 1 when a signal from the switching power supply of the power converter 17 (load FR5) is applied, the internal-temperature calculating unit 7 that calculates the internal temperature of the storage device 1 by using a signal with the second frequency, the signal being entered from the power converter 17 (load FR5), and the current and voltage that are respectively detected by the current detecting unit 4 and voltage detecting unit 6, the state calculating unit 8 that calculates the state of the storage device 1 by using an entered signal with the first frequency and the detected current and voltage, and the state detecting unit 9 that corrects the state calculated by the state calculating unit 8 by using the internal temperature calculated by the internal-temperature calculating unit 7 and then performs inference.

As described above, in the state detection method, in the seventh embodiment of the present invention, for the storage device 1, the initial SOH or initial SOC of the storage device 1 is calculated from the measured value of the internal resistance of the storage device 1 at a first frequency, the internal temperature is calculated from the measured impedance value of the internal impedance of the storage device 1, and the SOH or SOC is inferred by using the calculated value of the internal temperature to correct the initial SOH or initial SOC, so an accurate SOH or SOC can be obtained because the initial SOC or initial SOH can be corrected according to the calculated internal temperature. Particularly, since the internal impedance of the storage device 1 is measured by using a signal with a second frequency at which the internal impedance of the storage device 1 is increased as a temperature is raised, the resistance, depending only on the temperature, of the storage device 1 in electronic conduction can be measured and the internal temperature of the storage device 1 can thereby be more accurately measured. Therefore, the initial SOH or initial SOC can be corrected according to the accurate internal temperature. Thus, the SOH or SOC of the storage device 1 can be accurately detected.

Furthermore, since the internal impedance of the storage device 1 is measured by using a signal, with the second frequency, that is generated from the switching power supply of the power converter 17 (load FR5) connected to the storage device 1, there is no need to provide the alternating-current signal source 5H, which has been used in the measurement system 101 in the first embodiment, the measurement system 103 in the third embodiment, and the measurement system 106 in the sixth embodiment. Therefore, it is possible to maintain high precision in temperature measurement and to reduce a cost required for the measurement system 107 used in the state detection method, in the seventh embodiment of the present invention, for the storage device 1.

The structure and method in the seventh embodiment of the present invention can be practiced by appropriately combining them with structures and methods in other embodiments. So far, in the seventh embodiment, a method of detecting the SOH and SOC of the storage device 1 by using the measurement system 107 has been described. However, the method is not limited to the detection of the SOH and the SOC with the same apparatus; a method of detecting only the SOH or only the SOC is also included.

Eighth Embodiment

Figure 11:
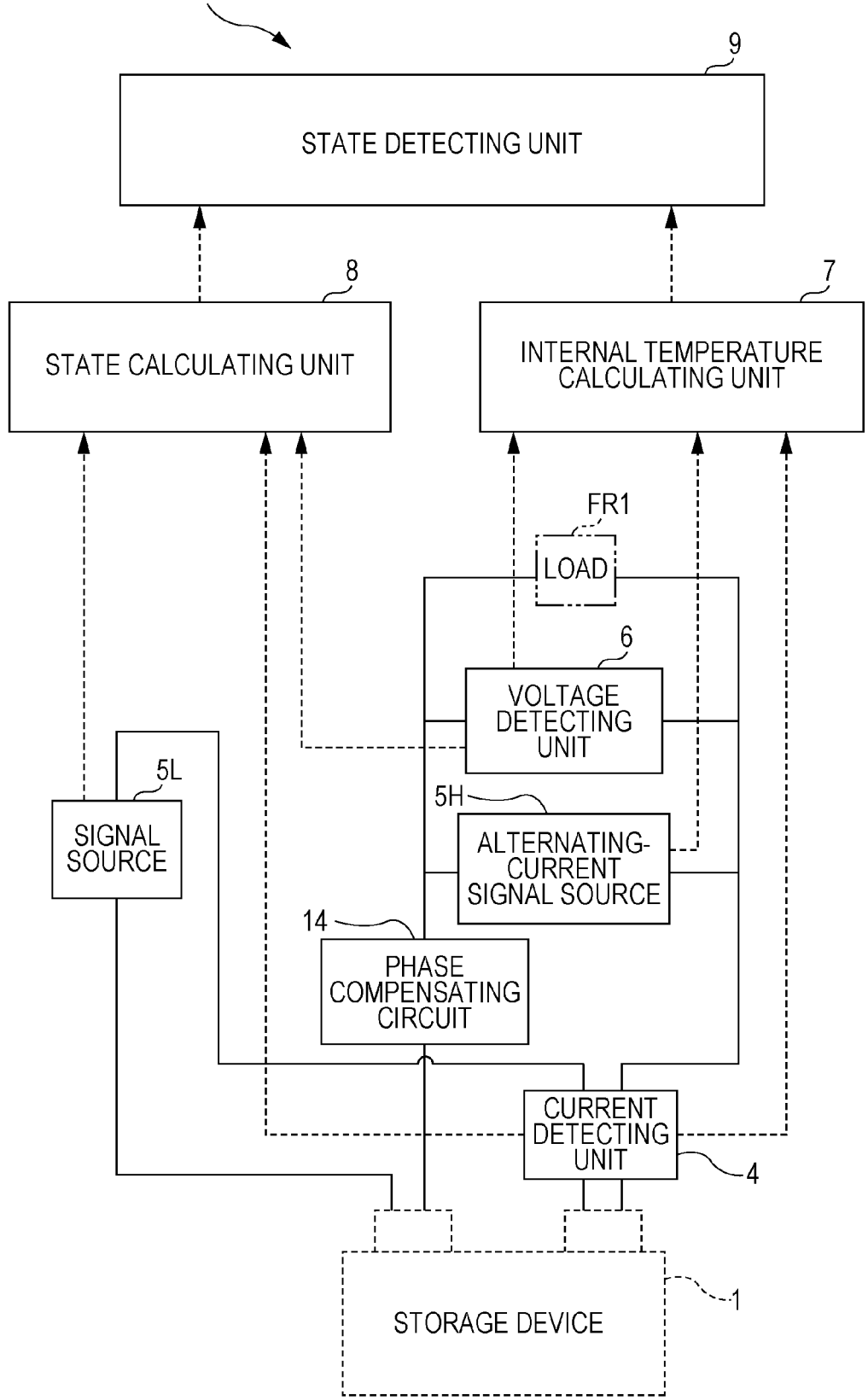
FIG. 11 illustrates a storage device state detection method in an eighth embodiment of the present invention; the drawing being a block diagram of a measurement system that measures the states (SOH and SOC) of the storage device.
Figure 12:
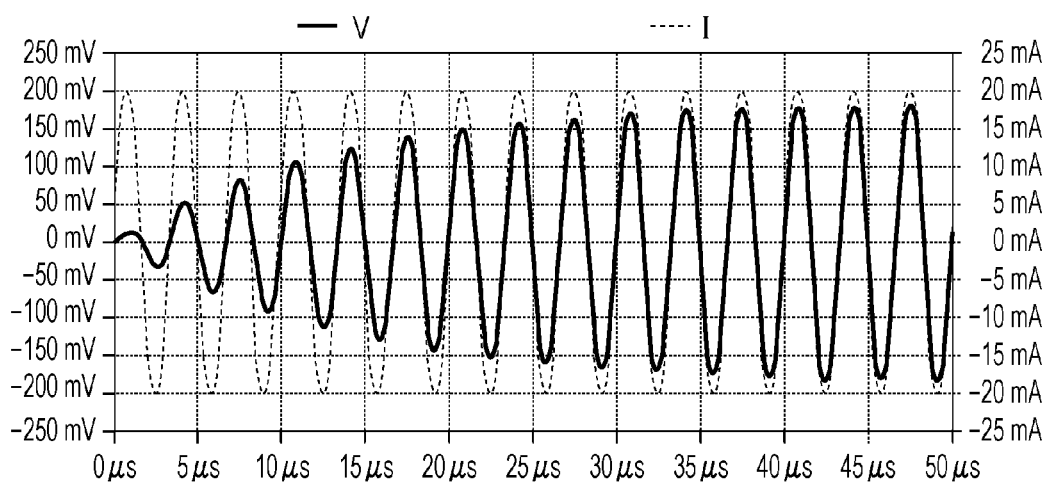
FIG. 12 illustrates the storage device state detection method in the eight embodiment of the present invention; the drawing being a graph representing a state in which a current phase and a voltage phase match.

FIG. 11 illustrates a state detection method in an eighth embodiment of the present invention for the storage device 1; the drawing is a block diagram of a measurement system 108 that measures the states (SOH and SOC) of the storage device 1. FIG. 12 illustrates the state detection method in the eighth embodiment of the present invention, for the storage device 1; the drawing is a graph representing a state in which a current phase and a voltage phase match. The state detection method, in the eighth embodiment, for the storage device 1 differs from the first embodiment in that a phase compensating circuit 14 is used to match the current phase and voltage phase at a second frequency. As for the same structures as in the first embodiment, the same reference characters will be assigned and detailed descriptions will be omitted.

In the state detection method, in the eighth embodiment of the present invention, for the storage device 1, the measurement system 108, illustrated in FIG. 11, that measures the states (SOH and SOC) of the storage device 1 is used. As illustrated in FIG. 11, the measurement system 108 includes the signal source 5L used to supply an alternating-current signal with a first frequency or a direct-current signal to the storage device 1, the alternating-current signal source 5H used to supply a signal with the second frequency to the storage device 1, the current detecting unit 4 and voltage detecting unit 6 that respectively detect a current and a voltage observed by the storage device 1 when the signal from the alternating-current signal source 5H is applied, the internal-temperature calculating unit 7 that calculates the internal temperature of the storage device 1 by using an entered signal with the second frequency, and the detected current and voltage, the state calculating unit 8 that calculates the state of the storage device 1 by using an entered signal with the first frequency and the detected current and voltage, and the state detecting unit 9 that corrects the state calculated by the state calculating unit 8 by using the internal temperature calculated by the internal-temperature calculating unit 7 and then performs inference.

The phase compensating circuit 14 is connected to the storage device 1; the phase compensating circuit 14 is used to match a current phase and a voltage phase produced by the signal with the second frequency, the signal being from the alternating-current signal source 5H. Usually, to obtain the internal impedance of the storage device 1, the current detecting unit 4 and voltage detecting unit 6 need to have high time resolution to measure a phase difference between a current and a voltage. In the measurement system 108 in the eighth embodiment of the present invention, however, the phase of a current and the phase of a voltage at the second frequency are matched by the phase compensating circuit 14, so even if the time resolution of the current detecting unit 4 and voltage detecting unit 6 is not high, the resistance component (real part) of the internal impedance of the storage device 1 can be precisely measured. Furthermore, since there is no need to calculate a phase difference between a current and a voltage, the internal impedance of the storage device 1 can be measured in real time.

It is preferable for the phase compensating circuit 14 to be provided so that it forms, together with the storage device 1, a series resonant circuit that resonates with the second frequency. Thus, an arrangement is made so that a capacitive reactor is provided that series resonates at the second frequency due to the inductive reactance of the storage device 1 at the second frequency. In this case, the imaginary part of the impedance can be made to be 0 at the resonance frequency, so if a signal with this resonance frequency (equivalent to the second frequency) is used, only the resistive component of the internal impedance of the storage device 1 can be detected.

At the second frequency used in the state detection method, in the eighth embodiment of the present invention, for the storage device 1, the inductance component of the impedance of the storage device 1 is dominant, that is, the reactance component is inductive, so it is preferable for the phase compensating circuit 14 to be formed so as to include a capacitor (not illustrated). In this case, the phase compensating circuit 14 can match the phase of a current and the phase of a voltage with a simple structure.

The graph in FIG. 12 indicates a state in which the phase of a current and the phase of voltage at the second frequency are matched by the resonant circuit formed with the storage device 1 and phase compensating circuit 14. FIG. 12 illustrates an example in which the alternating-current signal source 5H was used as a constant-current source to generate an alternating current with a maximum value of +20 mA and a minimum value of −20 mA at a frequency of 300 kHz. It is well seen from FIG. 12 that the phase of the current (indicated by the dotted lines) and the phase of the voltage (indicated by the solid lines) are matched by using the phase compensating circuit 14.

As described above, in the state detection method, in the eighth embodiment of the present invention, for the storage device 1, the initial SOH of the storage device 1 is calculated from the measured value of the internal resistance of the storage device 1 at a first frequency, the internal temperature is calculated from the measured impedance value of the internal impedance of the storage device 1, and the SOH is inferred by using the calculated value of the internal temperature to correct the initial SOH, so an accurate SOH can be obtained because the initial SOH can be corrected according to the calculated internal temperature. Particularly, since the internal impedance of the storage device 1 is measured by using a signal with a second frequency at which the inductance component of the internal impedance of the storage device 1 becomes more dominant than its inductance component, that is, its reactance component becomes inductive, the internal impedance can be measured in a state in which effects by the behavior of ions are adequately reduced and the internal temperature of the storage device 1 can thereby be more accurately measured. Therefore, the initial SOH can be corrected according to the accurate internal temperature. Thus, the SOH of the storage device 1 can be accurately detected.

When the phase of a current and the phase of a voltage are matched by the phase compensating circuit 14 connected to the storage device 1, even if the performance of a detecting apparatus is not high, the internal impedance of the storage device 1 can be precisely measured. Therefore, it is possible to maintain high precision in temperature measurement and to reduce a cost required for the measurement system 108.

Since the inductive reactor in the storage device 1 and the capacitive reactor in the phase compensating circuit 14 form a resonant circuit that resonates with the second frequency, the imaginary part of the impedance can be made to be 0 at this resonance frequency of the resonant circuit. Therefore, only the resistive component of the internal impedance of the storage device 1 can be detected by using a signal with the resonant frequency. Accordingly, the initial SOH or initial SOC can be corrected according to a more accurate internal temperature, and the SOH or SOC of the storage device 1 can thereby be even more accurately detected.

Since the phase compensating circuit 14 is formed so as to include a capacitor, the phase compensating circuit 14 can match the phase of a current and the phase of a voltage with a simple structure. Thus, it is possible to manufacture the phase compensating circuit 14 at a low cost and thereby to reduce a cost required for the measurement system 108 used in the state detection method, in the eighth embodiment of the present invention, for the storage device 1.

The structure and method in the eighth embodiment of the present invention can be practiced by appropriately combining them with structures and methods in other embodiments. So far, in the eighth embodiment, a method of detecting the SOH and SOC of the storage device 1 by using the measurement system 108 has been described. However, the method is not limited to the detection of the SOH and the SOC with the same apparatus; a method of detecting only the SOH or only the SOC is also included.

Ninth Embodiment

In a state detection method, in the ninth embodiment of the present invention, for the storage device 1, the internal impedance of the storage device 1 is measured under the condition that in the measurement system 106 illustrated in FIG. 9, for example, the impedance of the storage device 1 is lower than the impedance, as viewed from the storage device 1, of the charging circuit 11. The internal impedance of the storage device 1 is also measured under the condition that in the measurement system 107 illustrated in FIG. 10, for example, the impedance of the storage device 1 is lower than the impedance, as viewed from the storage device 1, of the load.

Specifically, if the impedance of the storage device 1 is denoted Z1, the impedance, as viewed from the storage device 1, of the load is denoted Z2, and the impedance, as viewed from the storage device 1, of the charging circuit 11 is denoted Z3, it is adapted that at the second frequency used in measurement, Z1 is smaller than Z2 or Z1 is smaller than Z3. In this case, effects by structures other than of the storage device 1 are small, so precision in internal impedance measurement can be increased. As a result, high measurement precision can be achieved.

Since the internal impedance of the storage device 1 is measured by using a signal with the second frequency at which the impedance of the storage device 1 is lower than the impedance of the charging circuit 11, effects by the charging circuit 11 are reduced in internal impedance measurement. Therefore, it is possible to increase precision in internal impedance measurement and thereby to calculate a temperature highly preciously. Accordingly, the initial SOH or initial SOC can be corrected according to the more accurate internal temperature, and the SOH or SOC of the storage device 1 can thereby be even more accurately detected.

Since the internal impedance of the storage device 1 is measured by using a signal with the second frequency at which the impedance of the storage device 1 is lower than the impedance of the load, effects by the load are reduced in internal impedance measurement. Therefore, it is possible to increase precision in internal impedance measurement and thereby to calculate a temperature highly preciously. Accordingly, the initial SOH or initial SOC can be corrected according to the more accurate internal temperature, and the SOH or SOC of the storage device 1 can thereby be even more accurately detected.

The structure and method in the ninth embodiment of the present invention can be practiced by appropriately combining them with structures and methods in other embodiments. So far, in the ninth embodiment, a method of detecting the SOH and SOC of the storage device 1 by using a measurement system has been described. However, the method is not limited to the detection of the SOH and the SOC with the same apparatus; a method of detecting only the SOH or only the SOC is also included.

The present invention is not limited to the above embodiments. For example, the present invention can also be practiced by being modified, for example, as described below. Modified embodiments are also included in the technical range of the present invention.

First Variation

Figure 13:
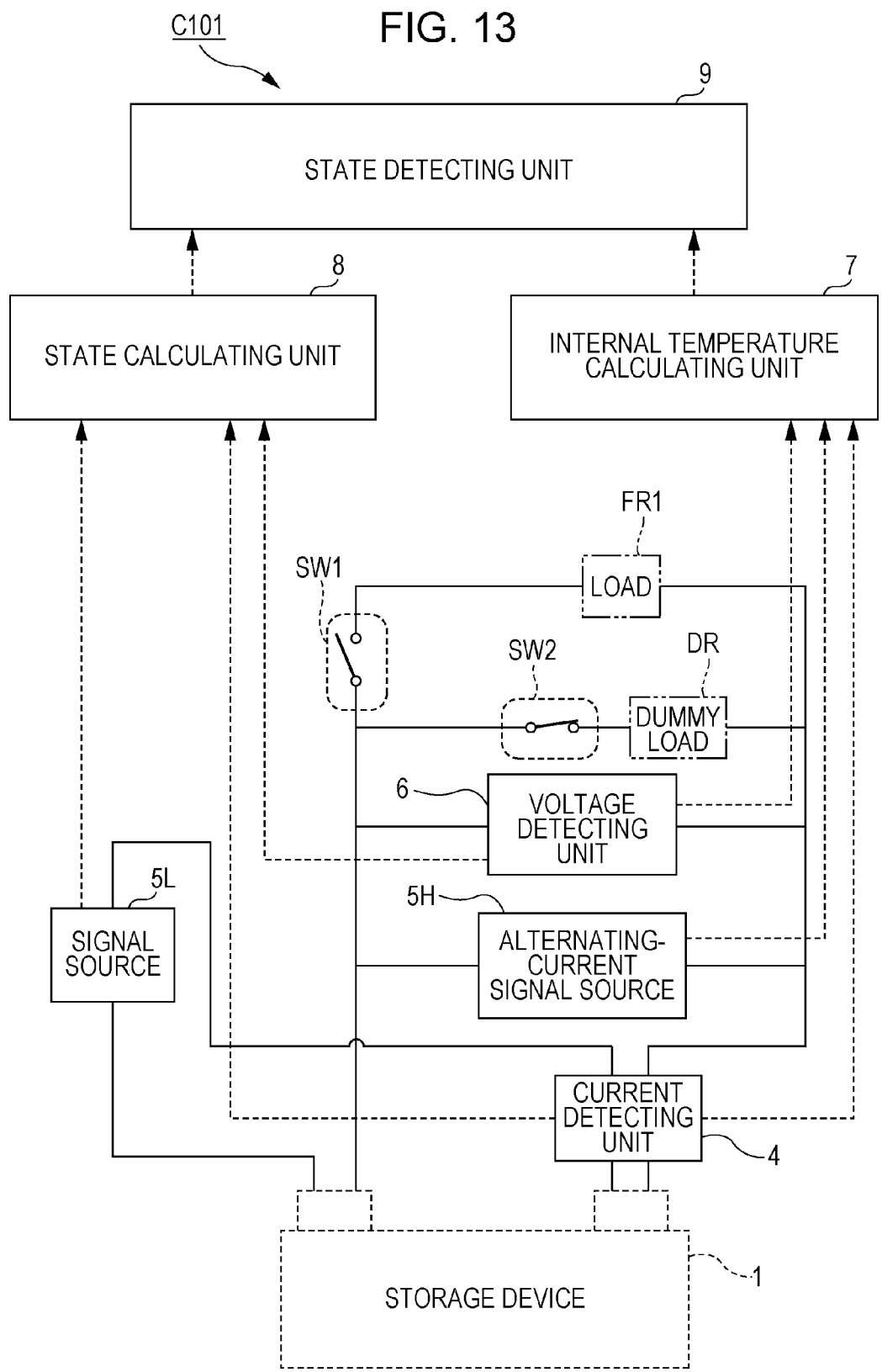
FIG. 13 illustrates a first variation of the storage device state detection method in the first embodiment of the present invention; the drawing being a block diagram of a measurement system that measures the internal temperature of the storage device.

FIG. 13 illustrates a first variation of the device state detection method, in the first embodiment of the present invention, for the storage device 1; the drawing is a block diagram of a measurement system C101 that measures the internal temperature of the storage device 1. A measurement system may be the measurement system C101, in which a switch SW1, a switch SW2, and a dummy load DR are added to the measurement portion in the measurement system 101 in the first embodiment described above, as illustrated in FIG. 13. Thus, if measurement is affected by the load FR1, when a measurement is made with the switch SW1 opened and the switch SW2 closed during a time while the load FR1 does not need to be driven, a more precious measured value can be obtained.

The present invention is not limited to the above embodiments. The present invention can be appropriately modified without departing from the intended scope of the present invention.

What is claimed is:

1. A method for detecting a state of a storage device in which an SOH (State of Health) or an SOC (State of Charge) of the storage device is estimated from an internal impedance thereof, the method comprising:
   measuring an internal resistance of the storage device using a first signal with a first frequency at which the internal impedance of the storage device decreases as a temperature rises, and calculating an initial SOH or an initial SOC of the storage device from the measured internal resistance;
   measuring the internal impedance of the storage device using a second signal with a second frequency at which the internal impedance of the storage device increases as the temperature rises, and calculating a value of an internal temperature of the storage device from the measured internal impedance; and
   estimating the SOH or the SOC using the calculated value of the internal temperature to correct the initial SOH or the initial SOC.

2. The method according to claim 1, wherein when the SOH is estimated, the SOC is substantially the same in each measurement of the internal resistance.

3. The method according to claim 2, wherein the SOH is estimated by measuring, the internal resistance is within a prescribed time period after the storage device has been fully charged.

4. The method according to claim 1, wherein the internal resistance is measured before and after a large change occurred in a current, and a value of the internal resistance is obtained from the measured internal resistance before and after the large change.

5. The method according to claim 1, wherein:
   the storage device is mounted in an automobile; and
   the automobile is stopped during the measurement of the internal resistance.

6. The method according to claim 1, wherein:
   a value of the measured internal impedance at the second frequency is calculated by converting a transient response signal induced by a pulse signal given to the storage device into a frequency component by a Fourier transform.

7. A method for detecting a state of a storage device in which an SOH (State of Health) or an SOC (State of Charge) of the storage device is estimated from an internal impedance thereof, the method comprising:
   measuring an internal resistance of the storage device using a first signal with a first frequency at which a capacitance component of the internal impedance of the storage device becomes more dominant than an inductance component of the internal impedance, and calculating an initial SOH or an initial SOC of the storage device from the measured internal resistance;
   measuring the internal impedance of the storage device using a second signal with a second frequency at which the inductance component of the internal impedance of the storage device becomes more dominant than the capacitance component of the internal impedance, and calculating a value of an internal temperature of the storage device from the measured internal impedance; and
   estimating the SOH or the SOC using the calculated value of the internal temperature to correct the initial SOH or the initial SOC.

8. The method according to claim 7, wherein when the SOH is estimated, the SOC is substantially the same in each measurement of the internal resistance.

9. The method according to claim 8, wherein the SOH is estimated by measuring, the internal resistance within a prescribed time period after the storage device has been fully charged.

10. The method according to claim 7, wherein the internal resistance is measured before and after a large change occurred in a current, and a value of the internal resistance is obtained from the measured internal resistance before and after the large change.

11. The method according to claim 7, wherein:
    the storage device is mounted in an automobile; and
    the automobile is stopped during the measurement of the internal resistance.

12. The method according to claim 7, wherein:
    a value of the measured internal impedance at the second frequency is calculated by converting a transient response signal induced by a pulse signal given to the storage device into a frequency component by a Fourier transform.

13. A method for detecting a state of a storage device in which an SOH (State of Health) or an SOC (State of Charge) of the storage device is estimated from an internal impedance thereof, the method comprising:
    measuring an internal resistance of the storage device using a first signal with a first frequency of 1 kHz or lower, and calculating an initial SOH or an initial SOC of the storage device from the measured internal resistance;
    measuring the internal impedance of the storage device using a second signal with a second frequency of 10 kHz or higher, and calculating a value of an internal temperature of the storage device from the measured internal impedance; and
    estimating the SOH or the SOC using the calculated value of the internal temperature to correct the initial SOH or the initial SOC.

14. The method according to claim 13, wherein when the SOH is estimated, the SOC is substantially the same in each measurement of the internal resistance.

15. The method according to claim 14, wherein the SOH is estimated by measuring, the internal resistance within a prescribed time period after the storage device has been fully charged.

16. The method according to claim 13, wherein the internal resistance is measured before and after a large change occurred in a current, and a value of the internal resistance is obtained from the measured internal resistance before and after the large change.

17. The method according to claim 13, wherein:
    the storage device is mounted in an automobile; and
    the automobile is stopped during the measurement of the internal resistance.

18. The method according to claim 13, wherein:
    a value of the measured internal impedance at the second frequency is calculated by converting a transient response signal induced by a pulse signal given to the storage device into a frequency component by a Fourier transform.

* * * * *